(12) United States Patent
Gross et al.

(10) Patent No.: US 8,108,758 B2
(45) Date of Patent: Jan. 31, 2012

(54) STOCHASTIC DECODING OF LDPC CODES

(75) Inventors: Warren J. Gross, Montreal (CA); Shie Mannor, Montreal (CA)

(73) Assignee: McGill University, Montreal, Quebec (*) Notice: Subject to any disclaimer, the term of this patent is extended or adjusted under 35 U.S.C. 154(b) by 1166 days.

(21) Appl. No.: 11/902,410

(22) Filed: Sep. 21, 2007

(65) Prior Publication Data

US 2008/0077839 A1  Mar. 27, 2008

Related U.S. Application Data

(60) Provisional application No. 60/846,333, filed on Sep. 22, 2006.

(51) Int. Cl.
  *H03M 13/45* (2006.01)
(52) U.S. Cl. ........................................ 714/780
(58) Field of Classification Search .................. 714/780
  See application file for complete search history.

(56) References Cited

U.S. PATENT DOCUMENTS

| | | | |
|---|---|---|---|
| 6,633,856 B2 | 10/2003 | Richardson et al. | |
| 6,862,552 B2 * | 3/2005 | Goldstein et al. | 702/179 |
| 7,904,795 B2 * | 3/2011 | Liao et al. | 714/784 |
| 2006/0156181 A1 | 7/2006 | Ha et al. | |

FOREIGN PATENT DOCUMENTS

| | | |
|---|---|---|
| EP | 1 511 177 A2 | 3/2005 |
| EP | 1 536 568 A1 | 6/2005 |

OTHER PUBLICATIONS

ISA/CA, International Search Report mailed Jan. 9, 2008, Gatineau, Canada.
Gaudet, Vincent C., et al.; "On Density Evolution and Dynamic Power Estimation in Stochastic Iterative Decoders", Proc. Fifth Analog Decoding Workshop, Torino, Italy, pp. 43-46, Jun. 5-6, 2006.
Nguyen, Jean, et al.; "Design of a Low Density Parity Check Iterative Decoder", pp. 1-6, SUPERB 2002 (Summer Undergraduate Program in Engineering Research at Berkeley), http://www.eecs.berkeley.edu/Programs/ugrad/superb/papers2002/nguyen.pdf.
Winstead, Chris, et al.; "Stochastic Iterative Decoders", in Proc. of the IEEE Int. Symp. on Information Theory, Sep. 2005, pp. 1116-1120.

(Continued)

Primary Examiner — Stephen Baker
(74) Attorney, Agent, or Firm — Freedman & Associates

(57) ABSTRACT

The present invention relates to a decoding method and system for stochastic decoding of LDPC codes. Each encoded sample of a set of encoded samples is first scaled by a scaling factor proportional to a noise level of the set of encoded samples. Each of the scaled encoded samples is then converted into a corresponding probability. For each probability a corresponding probability message is the generated by encoding each probability as a sequence of digital bits. Each probability message is then provided to a respective node of a logic circuitry for stochastic decoding. The logic circuitry represents a factor graph of the parity check matrix of the LDPC code. Using the logic circuitry each probability message is processed for determining an estimated sequence of information bits. If an equality node is in a hold state a chosen bit is provided from a corresponding edge memory which is updated by storing output bits from the equality node when the same is in a state other than a hold state.

20 Claims, 15 Drawing Sheets

OTHER PUBLICATIONS

Winstead, Chris et al.; "Analog Iterative Decoding of Error Control Codes", CCECE 2003—CCGEI 2003; May 2003, pp. 1-4.

Winstead, Chris, et al.; "Low-Voltage CMOS Circuits for Analog Iterative Decoders"; IEEE Trans. Circuits and Systems I: Regular Papers, vol. 53, Issue 4, Apr. 2006 pp.: 829-841.

Winstead, Chris; "Error-Control Decoders and Probabilistic Computation", in Tohoku Univ. 3rd SOIM-COE Conf., Sendai, Japan, Oct. 2005.

Gallager, R.G; "Low Density Parity Check Codes", Cambridge MA; MIT Press, 1963.

MacKay, D.J.C et al.; "Near Shannon Limit Performance of Low Density Parity Error Checks", Electron. Lett.; vol. 32, No. 18, pp. 1645-1646, 1996.

Richardson, T.J et al.; "The Capacity of Low Density Parity Check Codes under Message Passing Decoding"; IEEE Trans. Inform. Theory, vol. 47, pp. 599-618, Feb. 2001.

Kschischang, F. et al.; "Factor Graphs and the Sum Product Algorithm", IEEE Trans. Inform. Theory, vol. 47, No. 2, pp. 498-519, Feb. 2001.

Gaines, B; "Advances in Information Systems Science", Plenum, New York, Ch. 2, pp. 37-172.

Gaudet, V. et al.; "Iterative Decoding Using Stochastic Computation", Elect. Lett., vol. 39, No. 3, pp. 299-301, 2003.

Gross, W et al.; "Stochastic Implementation of LDPC Decoders", 39th Asilomar Conf. on Signals, Systems and Computers, Pacific Grove, CA, Nov. 2005.

* cited by examiner

Fig. 3
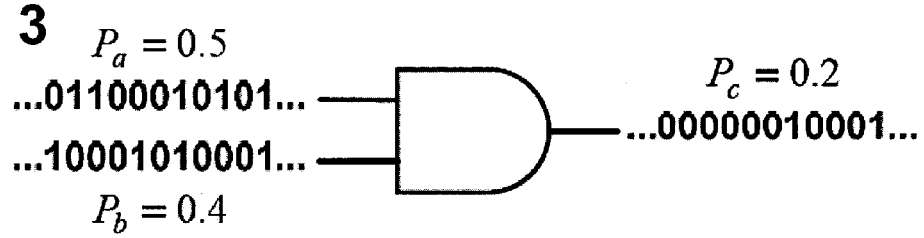
Fig. 4
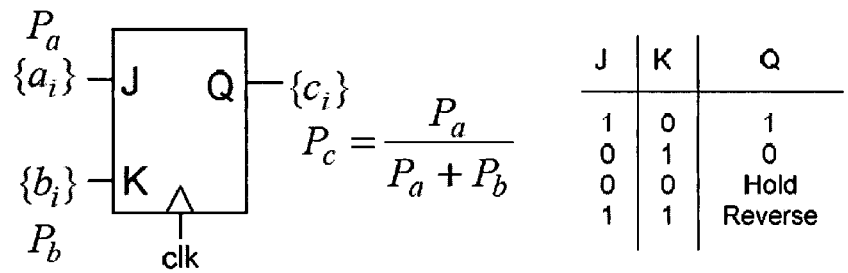
Fig. 5a
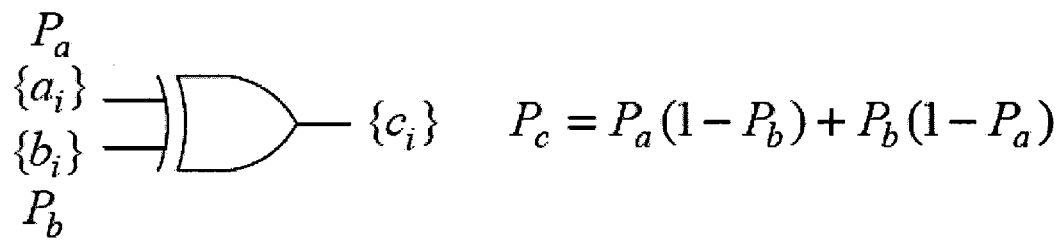
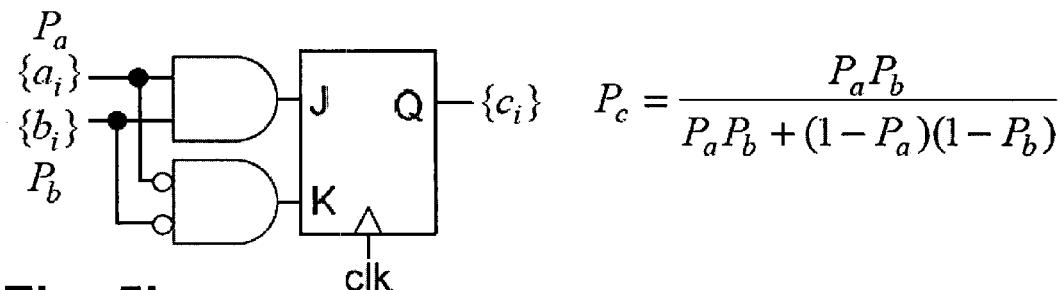
Fig. 5b

Fig. 9b  Fig. 9c

STOCHASTIC DECODING OF LDPC CODES

This application claims the benefit of U.S. Provisional Patent Application No. 60/846,333 filed Sep. 22, 2006, the entire contents of which are incorporated herein by reference.

FIELD OF THE INVENTION

This invention relates to decoding of linear codes with parity check matrix and in particular to a decoding method and system for stochastic decoding of LDPC codes.

BACKGROUND OF THE INVENTION

Data communication systems comprise three basic components: a transmitter; a transmission channel; and a receiver. Transmitted data become altered due to noise corruption and channel distortion. To reduce the presence of errors caused by noise corruption and channel distortion, redundancy is intentionally introduced, and the receiver uses a decoder to make corrections. In modern data communication systems, the use of error correction codes plays a fundamental role in achieving transmission accuracy, as well as in increasing spectrum efficiency. Using error correction codes, the transmitter encodes the data by adding parity check information and sends the encoded data through the transmission channel to the receiver. The receiver uses the decoder to decode the received data and to make corrections using the added parity check information.

Low Density Parity Check (LDPC) codes were first disclosed by Gallanger in the early 1960's, R. G. Gallager: "*Low Density Parity Check Codes*", Cambridge, Mass.: MIT Press, 1963. LDPC codes are linear codes which have been found to be capable of error correcting performance close to the Shannon limit, as disclosed in D. J. C. MacKay and R. M. Neal: "*Near Shannon limit performance of low density parity check codes*", Electron. Lett., vol. 32, no. 18, pp. 1645-1646, 1996, and in T. J. Richardson and R. Urbanke: "*The capacity of low density parity check codes under message passing decoding*", IEEE Trans. Inform. Theory, vol. 47, pp. 599-618, February 2001. Shortly after the development of Turbo codes researchers noticed that existing graphical representations such as Bayesian networks and factor graphs are unifying frameworks for LDPC decoding using a Sum Product (SP) process involving message passing over the edges of a factor graph, as disclosed in F. Kschischang, B. Frey, and H. Loeliger: "*Factor graphs and the sum product algorithm*", IEEE Trans. Inform. Theory, vol. 47, no. 2, pp. 498-519, February 2001. Unfortunately, hardware implementations of LDPC decoders based on this process are highly complex and costly.

Stochastic computation has been introduced in the 1960's as a method to design low precision digital circuits and is described, for example, in B. Gaines: "Advances in Information Systems Science", Plenum, New York, 1969, ch. 2, pp. 37-172. Stochastic computation has been used, for example, in neural networks. The main feature of stochastic computation is that probabilities are represented as streams of digital bits which are manipulated using simple circuitry. Its simplicity has made it attractive for the implementation of error correcting decoders in which complexity and routing congestion are major problems, as disclosed in the following references:

V. Gaudet and A. Rapley: "*Iterative decoding using stochastic computation*", Electron. Lett., vol. 39, no. 3, pp. 299-301, February 2003;

C. Winstead, V. Gaudet, A. Rapley, and C. Schlegel: "*Stochastic iterative decoders*", in Proc. of the IEEE Int. Symp. on Information Theory, September 2005, pp. 1116-1120;

C. Winstead: "*Error control decoders and probabilistic computation*", in Tohoku Univ. $3^{rd}$ SOIM-COE Conf., Sendai, Japan, October 2005; and, W. Gross, V. Gaudet, and A. Milner: "*Stochastic implementation of LDPC decoders*", in the $39^{th}$ Asilomar Conf. on Signals, Systems, and Computers, Pacific Grove, Calif., November 2005.

A major difficulty observed in stochastic decoding is the sensitivity to the level of switching activity—bit transition—for proper decoding operation, i.e. switching events become too rare and a group of nodes become locked into one state. To overcome this "latching" problem, C. Winstead, V. Gaudet, A. Rapley, and C. Schlegel: "*Stochastic iterative decoders*", in Proc. of the IEEE Int. Symp. on Information Theory, September 2005, pp. 1116-1120, teach "packetized supernodes" which prevent correlation between messages. A supernode is a special node which tabulates the incoming stochastic messages in histograms, estimates their probabilities and regenerates uncorrelated stochastic messages using random number generators. Unfortunately, the introduction of supernodes diminishes the advantages of the stochastic computation by necessitating complex hardware for implementing the supernodes. In addition to supernodes, C. Winstead: "*Error control decoders and probabilistic computation*", in Tohoku Univ. $3^{rd}$ SOIM-COE Conf., Sendai, Japan, October 2005, teaches scaling of channel LLRs to a maximum value to ensure the same level of switching activity for each block.

Unfortunately, these methods are not capable of successfully decoding state-of-the-art capacity-approaching LDPC codes on factor graphs.

It would be highly desirable to overcome the above limitations of the state of the art and to provide a method for iterative stochastic decoding of state-of-the-art capacity-approaching LDPC codes on factor graphs.

SUMMARY OF THE INVENTION

It is, therefore, an object of embodiments of the invention to provide a method and system for stochastic decoding of LDPC codes on factor graphs.

It is further an object of embodiments of the invention to provide a method and system for stochastic decoding of state-of-the-art LDPC codes on factor graphs resulting in a decoder having low-complexity hardware and high decoding performance.

In accordance with the present invention there is provided a method for stochastic decoding a set of encoded samples comprising:

a) receiving the set of encoded samples, the set of encoded samples being representative of a sequence of information bits and parity bits generated using a linear code with parity check matrix;

b) determining for each encoded sample a corresponding probability message;

c) providing each probability message in a symbol wise fashion to equality nodes of a logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix;

d) passing each probability message in a symbol wise fashion through the factor graph and performing for each received symbol at the parity check nodes the parity function and at the equality nodes the equality function, each of the equality nodes providing an output symbol in dependence upon each received symbol;
e) if an equality node is in a hold state, providing a chosen symbol;
f) determining an estimated sequence of information bits in dependence upon the output symbols provided by the equality nodes; and,
g) repeating b) to e) until a stopping criterion is satisfied.

In accordance with the present invention there is further provided a method for stochastic decoding a set of encoded samples comprising:
receiving the set of encoded samples, the set of encoded samples being representative of a sequence of information bits and parity bits generated using a linear code with parity check matrix;
scaling each of the encoded samples by a scaling factor proportional to a noise level of the set of encoded samples;
converting each of the scaled encoded samples into a corresponding probability;
generating for each probability a corresponding probability message by encoding each probability as a sequence of digital symbols;
providing each probability message to a respective node of a logic circuitry for stochastic decoding, the logic circuitry representing a factor graph of the parity check matrix; and,
using the logic circuitry processing each probability message for determining an estimated sequence of information bits.

In accordance with the present invention there is yet further provided a method for stochastic decoding a set of encoded samples comprising:
receiving the set of encoded samples, the set of encoded samples being representative of a sequence of information bits and parity bits generated using a linear code with parity check matrix;
using a lookup table determining for each encoded sample a corresponding probability message;
providing each probability message to a respective node of a logic circuitry for stochastic decoding, the logic circuitry representing a factor graph of the parity check matrix; and,
using the logic circuitry processing each probability message for determining an estimated sequence of information bits.

In accordance with the present invention there is yet further provided a method for stochastic decoding a set of encoded samples comprising:
receiving the set of encoded samples, the set of encoded samples being representative of a sequence of information bits and parity bits generated using a linear code with parity check matrix;
upscaling each of the encoded samples by an upscaling factor, the upscaling factor being determined such that switching activity in the stochastic decoder is increased;
converting each of the scaled encoded samples into a corresponding probability;
generating for each probability a corresponding probability message by encoding each probability as a sequence of digital symbols;
providing each probability message to a respective node of a logic circuitry for stochastic decoding, the logic circuitry representing a factor graph of the parity check matrix; and,
using the logic circuitry processing each probability message for determining an estimated sequence of information bits.

In accordance with the present invention there is yet further provided a method for stochastic decoding a set of encoded samples comprising:

a) receiving the set of encoded samples, the set of encoded samples being representative of a sequence of information bits and parity bits generated using a linear code with parity check matrix;
b) determining for each encoded sample a corresponding probability message;
c) providing each probability message in a symbol wise fashion to equality nodes of a logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix;
d) passing each probability message in a symbol wise fashion through the factor graph and performing for each received symbol at the parity check nodes the parity function and at the equality nodes the equality function, each of the equality nodes providing an output symbol in dependence upon each received symbol;
e) mapping the output symbols to bits after each DC;
f) determining convergence of the decoding in dependence upon switching activity of the mapped output symbols;
g) determining an estimated sequence of information bits in dependence upon the output symbols provided by the equality nodes; and,
h) repeating b) to f) until a stopping criterion based on the convergence is satisfied.

In accordance with the present invention there is provided a stochastic decoder for decoding a set of encoded samples comprising:
an input port for receiving the set of encoded samples, the set of encoded samples being representative of a sequence of information bits and parity bits generated using a linear code with parity check matrix;
source circuitry for providing a plurality of sequences of digital symbols;
processing circuitry in communication with the input port and the source circuitry, the processing circuitry for determining for each encoded sample a corresponding probability message based on at least a sequence of digital symbols of the plurality of sequences of digital symbols;
logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for:
  receiving each probability message in a symbol wise fashion at a respective equality node; and,
  passing each probability message in a symbol wise fashion through the factor graph and performing for each received symbol at the parity check nodes the parity function and at the equality nodes the equality function, each of the equality nodes providing an output symbol in dependence upon each received symbol;
second source circuitry interposed in the logic circuitry at predetermined locations and in communication with the equality nodes for providing a chosen symbol if an equality node is in a hold state; and,
output circuitry in communication with the logic circuitry for:
  receiving the output symbols from the equality nodes;
  determining if a stopping criterion has been satisfied; and,
  determining an estimated sequence of information bits in dependence upon the output symbols.

In accordance with the present invention there is further provided a stochastic decoder for decoding a set of encoded samples comprising:

an input port for receiving the set of encoded samples, the set of encoded samples being representative of a sequence of information bits and parity bits generated using a linear code with parity check matrix;

source circuitry for generating a sequence of digital symbols;

processing circuitry in communication with the input port and the source circuitry, the processing circuitry for:

scaling each of the encoded samples by a scaling factor proportional to a noise level of the set of encoded samples;

converting each of the scaled encoded samples into a corresponding probability; and, generating for each probability a corresponding probability message by encoding each probability as a sequence of digital symbols; and, logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for receiving the probability messages and for processing the probability messages for determining an estimated sequence of information bits based on stochastic decoding.

In accordance with the present invention there is yet further provided a stochastic decoder for decoding a set of encoded samples comprising:

an input port for receiving the set of encoded samples, the set of encoded samples being representative of a sequence of information bits and parity bits generated using a linear code with parity check matrix;

memory having stored therein a plurality of symbol sets, each symbol set comprising at least a symbol;

processing circuitry in communication with the input port and the memory, the processing circuitry for determining for each encoded sample a corresponding probability message based on at least a symbol set of the plurality of symbol sets; and, logic circuitry in communication with the processing circuitry, the logic circuitry comprising logic components representing a factor graph of the parity check matrix, the logic circuitry for receiving the probability messages and for processing the probability messages for determining an estimated sequence of information bits based on stochastic decoding.

In accordance with the present invention there is yet further provided a stochastic decoder for decoding a set of encoded samples comprising:

an input port for receiving the set of encoded samples, the set of encoded samples being representative of a sequence of information bits and parity bits generated using a linear code with parity check matrix;

source circuitry for providing a plurality of sequences of digital symbols;

processing circuitry in communication with the input port and the source circuitry, the processing circuitry for determining for each encoded sample a corresponding probability message based on at least a sequence of digital symbols of the plurality of sequences of digital symbols; and, logic circuitry in communication with the processing circuitry, the logic circuitry comprising logic components forming equality nodes and parity check nodes, the logic components of each of the equality nodes comprising a C element, the equality nodes and the parity check nodes for performing an equality function and a parity check function, respectively, the equality nodes and the parity check nodes being connected such that they represent a factor graph of the parity check matrix, the logic circuitry for receiving the probability messages and for processing the probability messages for determining an estimated sequence of information bits based on stochastic decoding.

In accordance with the present invention there is yet further provided a stochastic decoder for decoding a set of encoded samples comprising:

an input port for receiving the set of encoded samples, the set of encoded samples being representative of a sequence of information bits and parity bits generated using a linear code with parity check matrix;

source circuitry for generating a sequence of digital symbols;

processing circuitry in communication with the input port and the source circuitry, the processing circuitry for:

upscaling each of the encoded samples by an upscaling factor, the upscaling factor being determined such that switching activity in the stochastic decoder is increased;

converting each of the scaled encoded samples into a corresponding probability; and, generating for each probability a corresponding probability message by encoding each probability as a sequence of digital symbols; and, logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for receiving the probability messages and for processing the probability messages for determining an estimated sequence of information bits based on stochastic decoding.

In accordance with the present invention there is provided a storage medium having stored therein executable commands for execution on at least a processor, the at least a processor when executing the commands performing:

a) receiving a set of encoded samples, the set of encoded samples being representative of a sequence of information bits and parity bits generated using a linear code with parity check matrix;

b) determining for each encoded sample a corresponding probability message;

c) providing each probability message in a symbol wise fashion to equality nodes of a logic comprising equality nodes and parity check nodes, the equality nodes and the parity check nodes for performing an equality function and a parity check function, respectively, the equality nodes and the parity check nodes being connected such that they represent a factor graph of the parity check matrix;

d) passing each probability message in a symbol wise fashion through the factor graph and performing for each received symbol at the parity check nodes the parity function and at the equality nodes the equality function, each of the equality nodes providing an output symbol in dependence upon each received symbol;

e) if an equality node is in a hold state, providing a chosen symbol;

f) determining an estimated sequence of information bits in dependence upon the output symbols provided by the equality nodes; and, g) repeating b) to e) until a stopping criterion is satisfied.

In accordance with the present invention there is further provided a storage medium having stored therein executable commands for execution on at least a processor, the at least a processor when executing the commands performing:

least a processor, the at least a processor when executing the commands performing:

receiving a set of encoded samples, the set of encoded samples being representative of a sequence of information bits and parity bits generated using a linear code with parity check matrix;

scaling each of the encoded samples by a scaling factor proportional to a noise level of the set of encoded samples;

converting each of the scaled encoded samples into a corresponding probability;

generating for each probability a corresponding probability message by encoding each probability as a sequence of digital symbols;

providing each probability message to a respective node of a factor graph of the parity check matrix for stochastic decoding; and, processing each probability message for determining an estimated sequence of information bits.

In accordance with the present invention there is yet further provided a storage medium having stored therein executable commands for execution on at least a processor, the at least a processor when executing the commands performing:

receiving the set of encoded samples, the set of encoded samples being representative of a sequence of information bits and parity bits generated using a linear code with parity check matrix;

using a lookup table determining for each encoded sample a corresponding probability message; providing each probability message to a respective node of a factor graph of the parity check matrix for stochastic decoding; and, processing each probability message for determining an estimated sequence of information bits.

In accordance with the present invention there is yet further provided a storage medium having stored therein executable commands for execution on at least a processor, the at least a processor when executing the commands performing:

receiving a set of encoded samples, the set of encoded samples being representative of a sequence of information bits and parity bits generated using a linear code with parity check matrix;

upscaling each of the encoded samples by an upscaling factor, the upscaling factor being determined such that switching activity in the stochastic decoder is increased;

converting each of the scaled encoded samples into a corresponding probability;

generating for each probability a corresponding probability message by encoding each probability as a sequence of digital symbols;

providing each probability message to a respective node of a factor graph of the parity check matrix for stochastic decoding; and, processing each probability message for determining an estimated sequence of information bits.

In accordance with an aspect of the present invention there is provided a method for stochastic detecting comprising:

a) receiving a set of encoded samples, the set of encoded samples being representative of a sequence of information bits and parity bits generated using a linear code with parity check matrix;

b) determining for each encoded sample a corresponding probability message;

c) providing each probability message in a symbol wise fashion to equality nodes of a logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix;

d) passing each probability message in a symbol wise fashion through the factor graph and performing for each received symbol at the parity check nodes the parity function and at the equality nodes the equality function, each of the equality nodes providing an output symbol in dependence upon each received symbol;

e) if an equality node is in a hold state, providing a chosen symbol; and, f) repeating b) to e) until a stopping criterion is satisfied.

In accordance with the aspect of the present invention there is further provided a method for stochastic detecting comprising:

receiving the set of encoded samples, the set of encoded samples being representative of a sequence of information bits and parity bits generated using a linear code with parity check matrix;

scaling each of the encoded samples by a scaling factor proportional to a noise level of the set of encoded samples;

converting each of the scaled encoded samples into a corresponding probability;

generating for each probability a corresponding probability message by encoding each probability as a sequence of digital symbols; and, providing each probability message to a respective node of a logic circuitry for stochastic detecting, the logic circuitry representing a factor graph of the parity check matrix.

In accordance with the aspect of the present invention there is yet further provided a method for stochastic detecting comprising:

receiving a set of encoded samples, the set of encoded samples being representative of a sequence of information bits and parity bits generated using a linear code with parity check matrix;

using a lookup table determining for each encoded sample a corresponding probability message; and, providing each probability message to a respective node of a logic circuitry for stochastic detecting, the logic circuitry representing a factor graph of the parity check matrix.

In accordance with the aspect of the present invention there is yet further provided a method for stochastic detecting comprising:

receiving a set of encoded samples, the set of encoded samples being representative of a sequence of information bits and parity bits generated using a linear code with parity check matrix;

upscaling each of the encoded samples by an upscaling factor, the upscaling factor being determined such that switching activity in the stochastic decoder is increased;

converting each of the scaled encoded samples into a corresponding probability;

generating for each probability a corresponding probability message by encoding each probability as a sequence of digital symbols; and, providing each probability message to a respective node of a logic circuitry for stochastic detecting, the logic circuitry representing a factor graph of the parity check matrix.

In accordance with the aspect of the present invention there is yet further provided a method for stochastic detecting comprising:

a) receiving a set of encoded samples, the set of encoded samples being representative of a sequence of information bits and parity bits generated using a linear code with parity check matrix;

b) determining for each encoded sample a corresponding probability message;

c) providing each probability message in a symbol wise fashion to equality nodes of a logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix;

d) passing each probability message in a symbol wise fashion through the factor graph and performing for each received symbol at the parity check nodes the parity function and at the equality nodes the equality function, each of the equality nodes providing an output symbol in dependence upon each received symbol;

e) mapping the output symbols to bits after each DC;

f) determining convergence of the decoding in dependence upon switching activity of the mapped output symbols; and, g) repeating b) to f) until a stopping criterion based on the convergence is satisfied.

In accordance with the aspect of the present invention there is provided a stochastic detector comprising:

an input port for receiving a set of encoded samples, the set of encoded samples being representative of a sequence of information bits and parity bits generated using a linear code with parity check matrix;

source circuitry for providing a plurality of sequences of digital symbols;

processing circuitry in communication with the input port and the source circuitry, the processing circuitry for determining for each encoded sample a corresponding probability message based on at least a sequence of digital symbols of the plurality of sequences of digital symbols;

logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for:

receiving each probability message in a symbol wise fashion at a respective equality node; and, passing each probability message in a symbol wise fashion through the factor graph and performing for each received symbol at the parity check nodes the parity function and at the equality nodes the equality function, each of the equality nodes providing an output symbol in dependence upon each received symbol;

second source circuitry interposed in the logic circuitry at predetermined locations and in communication with the equality nodes for providing a chosen symbol if an equality node is in a hold state; and, output circuitry in communication with the logic circuitry for:

receiving the output symbols from the equality nodes; and, determining if a stopping criterion has been satisfied.

In accordance with the aspect of the present invention there is further provided a stochastic detector comprising:

an input port for receiving a set of encoded samples, the set of encoded samples being representative of a sequence of information bits and parity bits generated using a linear code with parity check matrix;

source circuitry for generating a sequence of digital symbols;

processing circuitry in communication with the input port and the source circuitry, the processing circuitry for:

scaling each of the encoded samples by a scaling factor proportional to a noise level of the set of encoded samples;

converting each of the scaled encoded samples into a corresponding probability; and, generating for each probability a corresponding probability message by encoding each probability as a sequence of digital symbols; and, logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for receiving the probability messages and for processing the probability messages for stochastic detecting.

In accordance with the aspect of the present invention there is yet further provided a stochastic detector comprising:

an input port for receiving a set of encoded samples, the set of encoded samples being representative of a sequence of information bits and parity bits generated using a linear code with parity check matrix;

memory having stored therein a plurality of symbol sets, each symbol set comprising at least a symbol;

processing circuitry in communication with the input port and the memory, the processing circuitry for determining for each encoded sample a corresponding probability message based on at least a symbol set of the plurality of symbol sets; and, logic circuitry in communication with the processing circuitry, the logic circuitry comprising logic components representing a factor graph of the parity check matrix, the logic circuitry for receiving the probability messages and for processing the probability messages for stochastic detecting.

In accordance with the aspect of the present invention there is yet further provided a stochastic detector comprising:

an input port for receiving a set of encoded samples, the set of encoded samples being representative of a sequence of information bits and parity bits generated using a linear code with parity check matrix;

source circuitry for providing a plurality of sequences of digital symbols;

processing circuitry in communication with the input port and the source circuitry, the processing circuitry for determining for each encoded sample a corresponding probability message based on at least a sequence of digital symbols of the plurality of sequences of digital symbols; and, logic circuitry in communication with the processing circuitry, the logic circuitry comprising logic components forming equality nodes and parity check nodes, the logic components of each of the equality nodes comprising a C element, the equality nodes and the parity check nodes for performing an equality function and a parity check function, respectively, the equality nodes and the parity check nodes being connected such that they represent a factor graph of the parity check matrix, the logic circuitry for receiving the probability messages and for processing the probability messages for stochastic detecting.

In accordance with the aspect of the present invention there is yet further provided a stochastic detector comprising:

an input port for receiving a set of encoded samples, the set of encoded samples being representative of a sequence of information bits and parity bits generated using a linear code with parity check matrix;

source circuitry for generating a sequence of digital symbols; processing circuitry in communication with the input port and the source circuitry, the processing circuitry for:

upscaling each of the encoded samples by an upscaling factor, the upscaling factor being determined such that switching activity in the stochastic decoder is increased;

converting each of the scaled encoded samples into a corresponding probability; and, generating for each probability a corresponding probability message by encoding each probability as a sequence of digital symbols; and, logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for receiving the probability messages and for processing the probability messages for stochastic detecting.

In accordance with the aspect of the present invention there is provided a storage medium having stored therein executable commands for execution on at least a processor, the at least a processor when executing the commands performing:

a) receiving a set of encoded samples, the set of encoded samples being representative of a sequence of information bits and parity bits generated using a linear code with parity check matrix;

b) determining for each encoded sample a corresponding probability message;

c) providing each probability message in a symbol wise fashion to equality nodes of a logic comprising equality nodes and parity check nodes, the equality nodes and the parity check nodes for performing an equality function and a parity check function, respectively, the equality nodes and the parity check nodes being connected such that they represent a factor graph of the parity check matrix;

d) passing each probability message in a symbol wise fashion through the factor graph and performing for each received symbol at the parity check nodes the parity function and at the equality nodes the equality function, each of the equality nodes providing an output symbol in dependence upon each received symbol;

e) if an equality node is in a hold state, providing a chosen symbol; and, g) repeating b) to e) until a stopping criterion is satisfied.

In accordance with the aspect of the present invention there is further provided a storage medium having stored therein executable commands for execution on at least a processor, the at least a processor when executing the commands performing:

receiving a set of encoded samples, the set of encoded samples being representative of a sequence of information bits and parity bits generated using a linear code with parity check matrix;

scaling each of the encoded samples by a scaling factor proportional to a noise level of the set of encoded samples;

converting each of the scaled encoded samples into a corresponding probability;

generating for each probability a corresponding probability message by encoding each probability as a sequence of digital symbols; and, providing each probability message to a respective node of a factor graph of the parity check matrix for stochastic detecting.

In accordance with the aspect of the present invention there is yet further provided a storage medium having stored therein executable commands for execution on at least a processor, the at least a processor when executing the commands performing:

least a processor, the at least a processor when executing the commands performing:

receiving the set of encoded samples, the set of encoded samples being representative of a sequence of information bits and parity bits generated using a linear code with parity check matrix;

using a lookup table determining for each encoded sample a corresponding probability message; and, providing each probability message to a respective node of a factor graph of the parity check matrix for stochastic detecting.

In accordance with the aspect of the present invention there is yet further provided a storage medium having stored therein executable commands for execution on at least a processor, the at least a processor when executing the commands performing:

least a processor, the at least a processor when executing the commands performing:

receiving a set of encoded samples, the set of encoded samples being representative of a sequence of information bits and parity bits generated using a linear code with parity check matrix;

upscaling each of the encoded samples by an upscaling factor, the upscaling factor being determined such that switching activity in the stochastic decoder is increased;

converting each of the scaled encoded samples into a corresponding probability;

generating for each probability a corresponding probability message by encoding each probability as a sequence of digital symbols; and, providing each probability message to a respective node of a factor graph of the parity check matrix for stochastic detecting.

BRIEF DESCRIPTION OF THE FIGURES

Exemplary embodiments of the invention will now be described in conjunction with the following drawings, in which:

FIG. 3 is a diagram illustrating multiplication in stochastic computation;

FIG. 4 is a diagram illustrating division in stochastic computation;

FIG. 5a is a simplified block diagram illustrating a parity check node in stochastic decoding;

FIG. 5b is a simplified block diagram illustrating an equality node in stochastic decoding;

FIG. 8 is a simplified flow diagram of a first embodiment of a method for stochastic decoding according to the invention for execution on the stochastic decoder shown in FIG. 7a;

FIGS. 9a to 9c are a simplified block diagram of a second embodiment of a stochastic decoder according to the invention;

DETAILED DESCRIPTION OF THE INVENTION

The following description is presented to enable a person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the invention. Thus, the present invention is not intended to be limited to the embodiments disclosed, but is to be accorded the widest scope consistent with the principles and features disclosed herein.

For the sake of clarity and to provide a better understanding of the invention, a brief overview of LDPC codes, factor graphs, SP decoding, and stochastic computation on factor graphs will be presented in the following.

LDPC codes are a class of binary linear block codes in which a set of code words, $x \in C$, spans the null space of a sparse parity check matrix H. A (n,k) binary LDPC code is then implemented using a $(n-k) \times n$ parity check matrix H in which $Hx=0$. Equation (1) is an example of a parity check matrix for a (12,3) LDPC code:

$$H = \begin{bmatrix} 0 & 0 & 1 & 0 & 0 & 1 & 1 & 1 & 0 & 0 & 0 & 0 \\ 1 & 1 & 0 & 0 & 1 & 0 & 0 & 0 & 0 & 0 & 0 & 1 \\ 0 & 0 & 0 & 1 & 0 & 0 & 0 & 0 & 1 & 1 & 1 & 0 \\ 0 & 0 & 0 & 0 & 1 & 1 & 1 & 0 & 0 & 1 & 0 & 0 \\ 1 & 0 & 1 & 0 & 0 & 0 & 0 & 1 & 0 & 0 & 1 & 0 \\ 0 & 1 & 0 & 1 & 0 & 0 & 0 & 0 & 1 & 0 & 0 & 1 \\ 1 & 1 & 0 & 1 & 0 & 0 & 1 & 0 & 0 & 0 & 0 & 0 \\ 0 & 0 & 0 & 0 & 0 & 1 & 0 & 1 & 0 & 0 & 1 & 1 \\ 0 & 0 & 1 & 0 & 1 & 0 & 0 & 0 & 1 & 1 & 0 & 0 \end{bmatrix} \quad (1)$$

Figure 1:
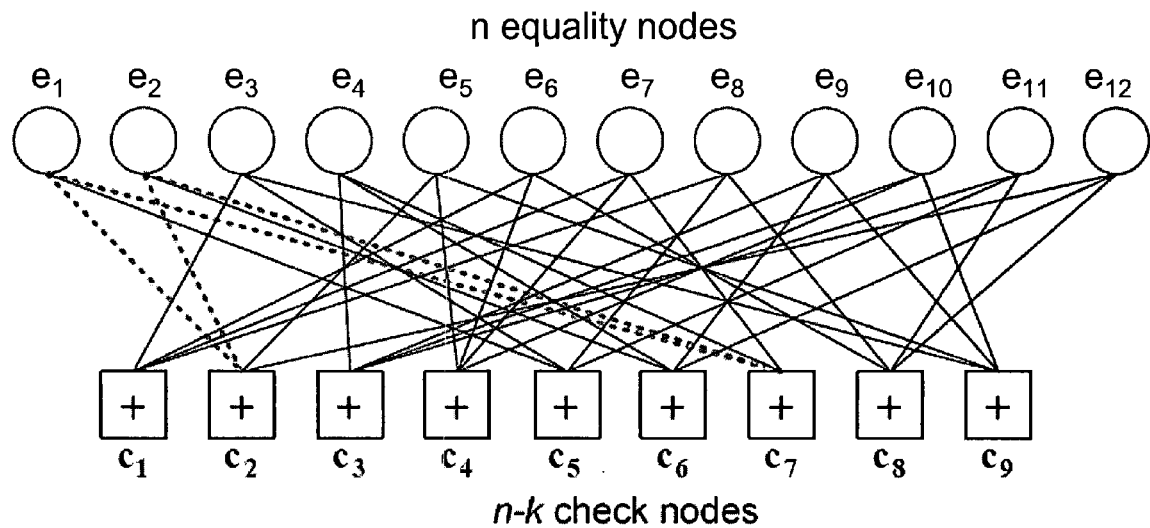
FIG. 1 is a diagram illustrating a factor graph of a parity check matrix.

LDPC codes are effectively represented using a bipartite graph called a factor graph. Factor graphs provide a complete representation of the code, as well as help to describe the decoding process. FIG. 1 illustrates the factor graph of the parity check matrix H in equation (1). Nodes of a factor graph are separated into two distinct sets—equality nodes and check nodes. Each edge in the graph connects a node from the two sets. This factor graph comprises $n=12$ equality nodes and $n-k=9$ check nodes. Check node $c_i$ is connected to equality node $e_j$ if and only if element $h_{ij}$ of the parity check matrix H is one. The number of edges connected to a node is called degree of the node. In regular LDPC codes the equality node degree, $d_e$, and the check node degree, $d_c$, are the same for all equality nodes and parity check nodes, respectively. In irregular LDPC codes $d_e$ and $d_c$ vary for different nodes.

The SP process, also known as message passing process, is an iterative process used for LDPC decoding. The SP process uses message passing over the edges of factor graphs. It has been shown that SP processes are capable of closely approximating the optimal decoding process for Additive White Gaussian Noise (AWGN) channels, i.e. the Maximum A posteriori Probability (MAP) process, as taught in C. B. Schlegel and L. C. Perez: "*Trellis and Turbo Coding*", IEEE Press, 2004. The decoding performance is dependent on the length of cycles in the factor graph, i.e. the longer the cycles the better the decoding performance. Short cycles such as the 4-cycle—indicated by dashed lines in FIG. 1—correlate the messages and degrade the decoding performance.

In the SP process a Log-Likelihood Ratio (LLR) of a received binary sequence is determined and a decision is made by comparing the LLR to a threshold value. In a Binary Phase Shift Keying (BPSK) transmission (±1) over an AWGN channel, the channel LLR value of the i-th sample in a received block (i=1, ..., n) is defined as:

$$L_i = \log\left(\frac{Pr(x_i = +1 \mid y_i)}{Pr(x_i = -1 \mid y_i)}\right) = \frac{2y_i}{\sigma^2}, \quad (2)$$

where $\sigma^2$ is the variance of the AWGN and, $x_i \in \{-1,+1\}$ and $y_i \in R$ denote the i-th sample of the transmitted and received block, respectively. For example, let $P_{i \to j} \in [0,1]$ be a probability message from equality node $e_i$ to check node $c_j$ (j=1, ..., m), and $Q_{j \to i} \in [0,1]$ be a probability message from check node $c_j$ to equality node $e_i$. Also, let $\{e_i, e_l, e_m\}$ be a set of equality nodes connected to a $d_c=3$ check node $c_j$, and $\{c_j, c_r, c_s\}$ be a set of check nodes connected to a $d_e=3$ equality node $e_i$. It is noted, that this is without loss of generality, since it is possible to convert higher degree nodes to subgraphs containing only degree three nodes. Message passing steps in the SP process are then described as follows.

I) For equality node $e_i$, convert $L_i$ to an initialization probability as $P_{init}^{i} = e^{L_i}/(e^{L_i}+1)$.

II) The equality node $e_i$ sends $P_{i \to j} = P_{init}^{i}$ to check node $c_j$.

Figure 2A:
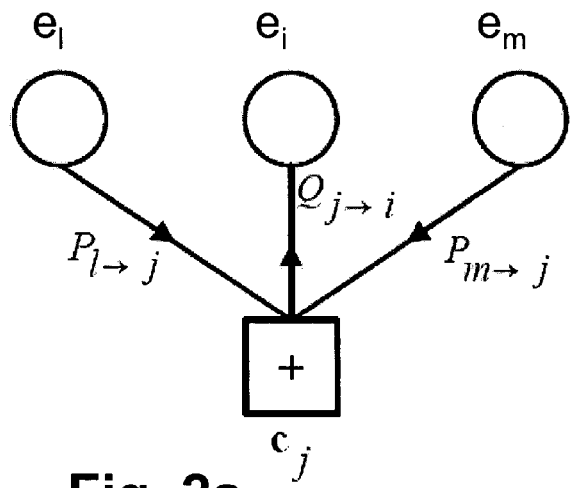
FIGS. 2a and 2b are diagrams illustrating processing of probability message in a SP process.

III) The check node $c_j$ determines $Q_{j \to i}$ and sends it to the equality node $e_i$, as shown in FIG. 2a, with $Q_{j \to i}$ being determined as:

$$Q_{j \to i} = P_{l \to j}(1 - P_{m \to j}) + P_{m \to j}(1 - P_{l \to j}). \quad (3)$$

Figure 2B:
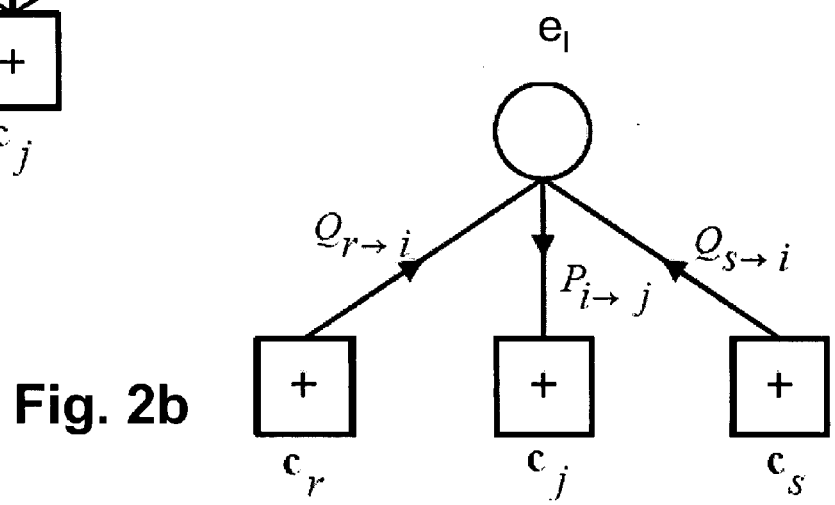

IV) The equality node $e_i$ determines $P_{i \to j}$ and sends it to the check node $c_j$, as shown in FIG. 2b, with $P_{i \to j}$ being determined as:

$$P_{i \to j} = \frac{Q_{r \to i} Q_{s \to i}}{Q_{r \to i} Q_{s \to i} + (1 - Q_{r \to i})(1 - Q_{s \to i})}. \quad (4)$$

V) Return to step III.

VI) Stop the iteration once the estimated code word, $\hat{x}$, satisfies the criterion $H\hat{x}=0$, or after a predetermined number of iterations has been completed.

The hardware implementation of the above SP process requires at each node of the factor graph complex computational operations on probabilities necessitating provision of a large number of hardware components. Furthermore, in the SP process probability messages are passed between the nodes resulting in routing congestion problems. As is evident, these problems are substantially increased for long LDPC codes. For example, the hardware implementation of a fully parallel LDPC decoder with n=1000, $d_e$=3 and 4-bit fixed point representation of the probabilities requires 24000 physical wires—for two directions—to accommodate all edges of the factor graph.

In stochastic computation, the probabilities are encoded using a Bernoulli sequence as a random sequence of $\{a_i\}$ digital bits. It is noted, that in stochastic computation used in decoding processes it is possible to encode the probabilities using deterministic or pseudo-random sequences. Each bit in the sequence is equal to logic '1' with the probability to be encoded. A sequence of N bits with m bits equal to '1' represents the probability of m/N. For example, a sequence of 10 bits with 6 bits equal to logic '1' represents the probability of 0.6. The encoding scheme is not unique, i.e. different encoded stochastic sequences represent a same probability such as:

$$0.6 \rightarrow \begin{cases} 0110011101 \\ 1101010101 \\ 0110100111 \end{cases}$$

The stochastic representation of probabilities enables manipulation of the same using hardware of low complexity. Stochastic multiplication and stochastic division are the two operations used for implementing the decoding process.

For example, let $P_a$=Pr($a_i$=1) and $P_b$=Pr($b_i$=1) be the probabilities to be multiplied. The outcome, $P_c$=$P_a P_b$, is then determined using an AND gate, as shown in FIG. 3. Similarly, other gates—NOT, XOR, etc. —are used to implement different probability operations.

FIG. 4 illustrates a JK flip-flop with input sequences of $\{a_i\}$ and $\{b_i\}$ representing the probabilities of $P_a$ and $P_b$, respectively. The output bit $c_i$ is equal to logic '1' with the probability of $P_c$ and is equal to logic '0' with the probability of 1−$P_c$. Random output transition from logic '1' to '0' occurs with the probability of (1−$P_c$)$P_a$ and the reverse transition occurs with the probability of $P_c P_b$. From the equality of the expected occurrence of random transition in both directions follows:

$$P_c P_b = (1 - P_c)P_a \rightarrow P_c = \frac{P_a}{P_a + P_b}. \quad (5)$$

The operation of equation (5) is an approximation to $P_a/P_b$, if $P_a \ll P_b^2$.

The stochastic representation of probability messages in the code factor graph enables hardware implementation of bit-serial parity check nodes and equality nodes having low complexity. Let $P_a$=Pr($a_i$=1) and $P_b$=Pr($b_i$=1) be the probability of two input bits, $a_i$ and $b_i$, in a $d_c$=3 parity check node. The output probability $P_c$ is then determined as $$P_c = P_a(1-P_b) + P_b(1-P_a). \quad (6)$$

The equality function in a $d_e$=3 equality node for inputs $P_a$ and $P_b$ is determined as $$P_c = \frac{P_a P_b}{P_a P_b + (1 - P_a)(1 - P_b)}. \quad (7)$$

FIGS. 5a and 5b illustrate the corresponding hardware structures of the parity check node—equation (6)—and the equality node—equation (7), respectively. As is evident to those skilled in the art, higher degree parity check nodes and equality nodes are easily converted to sub-graphs containing only degree three parity check nodes and equality nodes, respectively. It is noted that the equality node shown in FIG. 5b "holds" on the previous output bit (i.e., $c_i$=$c_{i-1}$) on the edge, if the two input bits are not equal ($a_i \neq b_i$).

In addition to simple equality node and parity check node structures, the stochastic computation also reduces the routing congestion problem, since only one bit—per direction—is needed to represent an edge between a parity check node and an equality node. This implies that in a decoding round, the stochastic decoding proceeds by the equality nodes and the parity check nodes exchanging a bit—per direction—along each edge in the code factor graph. In the following, these decoding rounds will be referred to as Decoding Cycles (DCs) to highlight the fact that they do not directly correspond to the iterations in the SP process.

Figure 6:
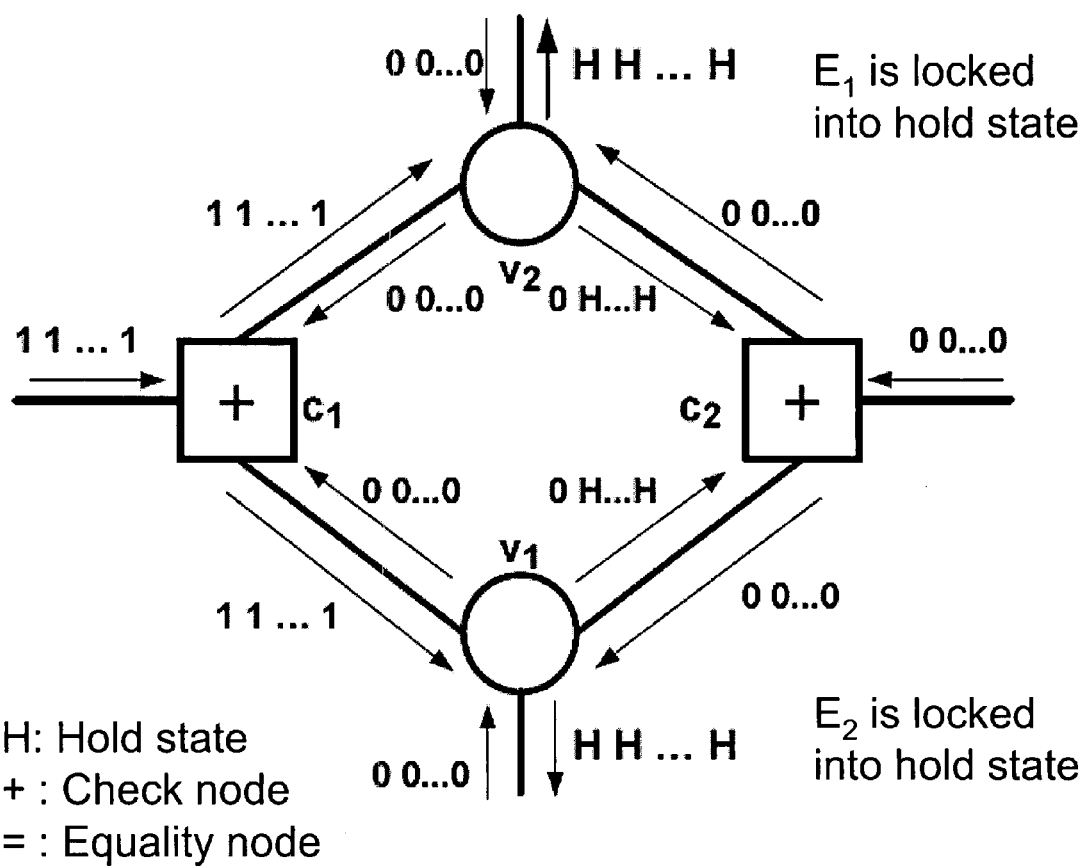
FIG. 6 is a simplified block diagram illustrating an example of latching within a 4-cycle in a factor graph.

A major difficulty observed in stochastic decoding is the sensitivity to the level of switching activity—bit transition—for proper decoding operation. The "latching" problem is described for stochastic decoding on graphs with cycles in C. Winstead, V. Gaudet, A. Rapley, and C. Schlegel: "*Stochastic iterative decoders*", in Proc. of the IEEE Int. Symp. on Information Theory, September 2005, pp. 1116-1120. This problem refers to the situation where a cycle in the graph correlates messages in such a way that causes a group of nodes to lock into a state which is solely maintained by the correlated messages. The latching problem is particularly acute in LDPC decoders as taught in C. Winstead: "*Error control decoders and probabilistic computation*", in Tohoku Univ. 3$^{rd}$ SOIM-COE Conf., Sendai, Japan, October 2005. Further, the latching problem is increased at high Signal-to-Noise-Ratios (SNRs) where the received LLRs become so large that the corresponding probabilities approach 0 (or 1). In this situation, the stochastic sequences contain mostly bits of logic '0' (or '1'), thus switching events become too rare for proper decoding operation. FIG. 6 illustrates how the lack of switching activity within a 4-cycle forces the equality nodes into a "hold" state for several DCs.

In an attempt to overcome the latching problem, C. Winstead, V. Gaudet, A. Rapley, and C. Schlegel: "*Stochastic iterative decoders*", in Proc. of the IEEE Int. Symp. on Information Theory, September 2005, pp. 1116-1120, teach "packetized supernodes" which prevent correlation between messages. A supernode is a special equality node which tabulates the incoming stochastic messages in histograms, estimates their probabilities and regenerates uncorrelated stochastic messages using random number generators. The supernodes were used for trellis decoding of a (256,121) product Turbo code with the supernodes replacing all the equality nodes such that they were performing the conventional SP calculation according to equation (4) after a time step to calculate the probabilities of the new outgoing messages and to regenerate new stochastic messages. In addition to supernodes, C. Winstead: "*Error control decoders and probabilistic computation*", in Tohoku Univ. 3$^{rd}$ SOIM-COE Conf., Sendai, Japan, October 2005, teaches scaling of channel LLRs for stochastic decoding of a (16,11) Hamming code. In this method, the channel LLRs for each block are scaled to a maximum value to ensure the same level of switching activity for each block. As is evident, the introduction of supernodes diminishes the advantages of the stochastic computation by necessitating a highly complex hardware structure for implementing the supernodes. Furthermore, it has been found that this technique is not applicable for the decoding of numerous LDPC and Hamming codes.

Figure 7A:
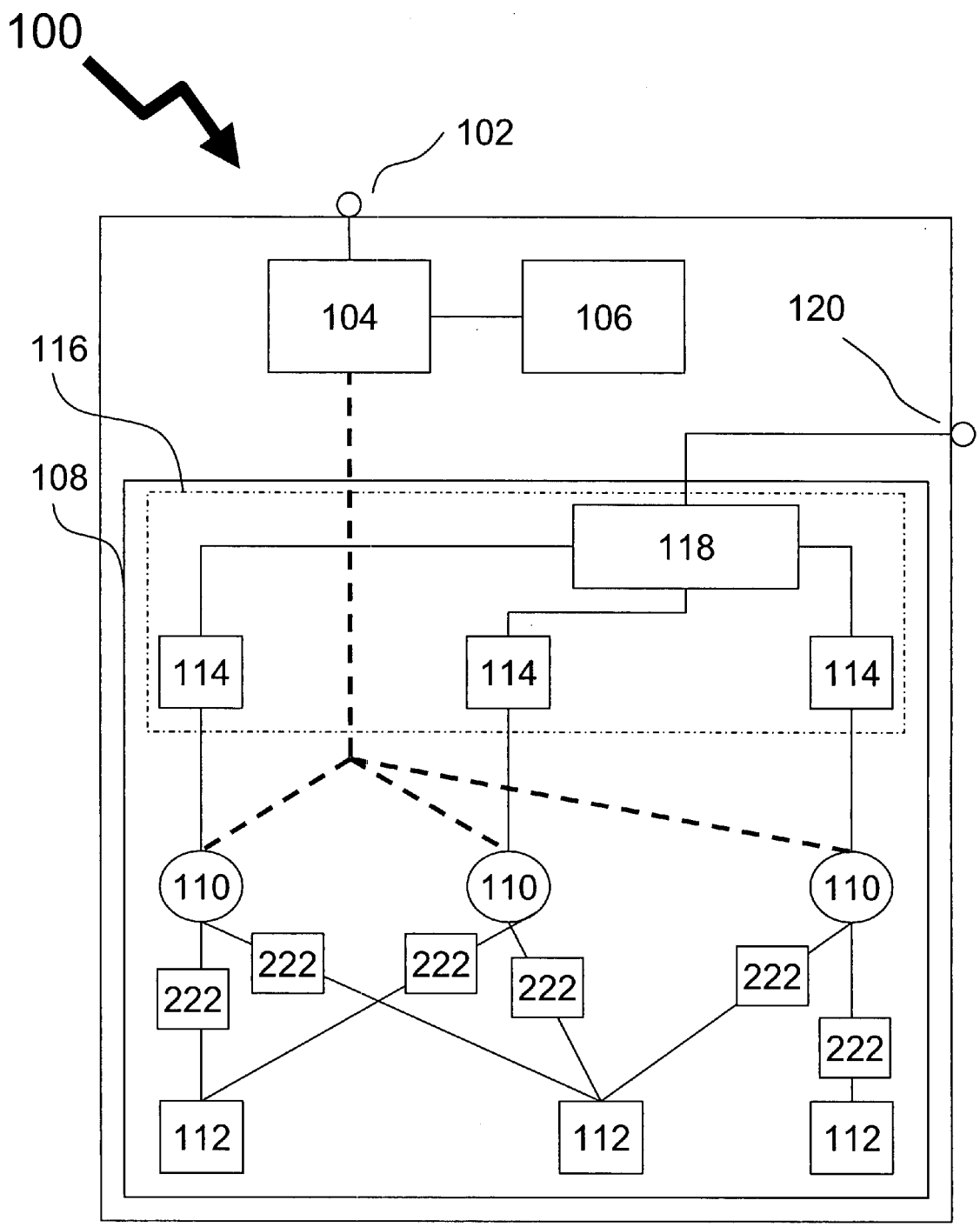
FIG. 7a is a simplified block diagram of a first embodiment of a stochastic decoder according to the invention.
Figure 8:
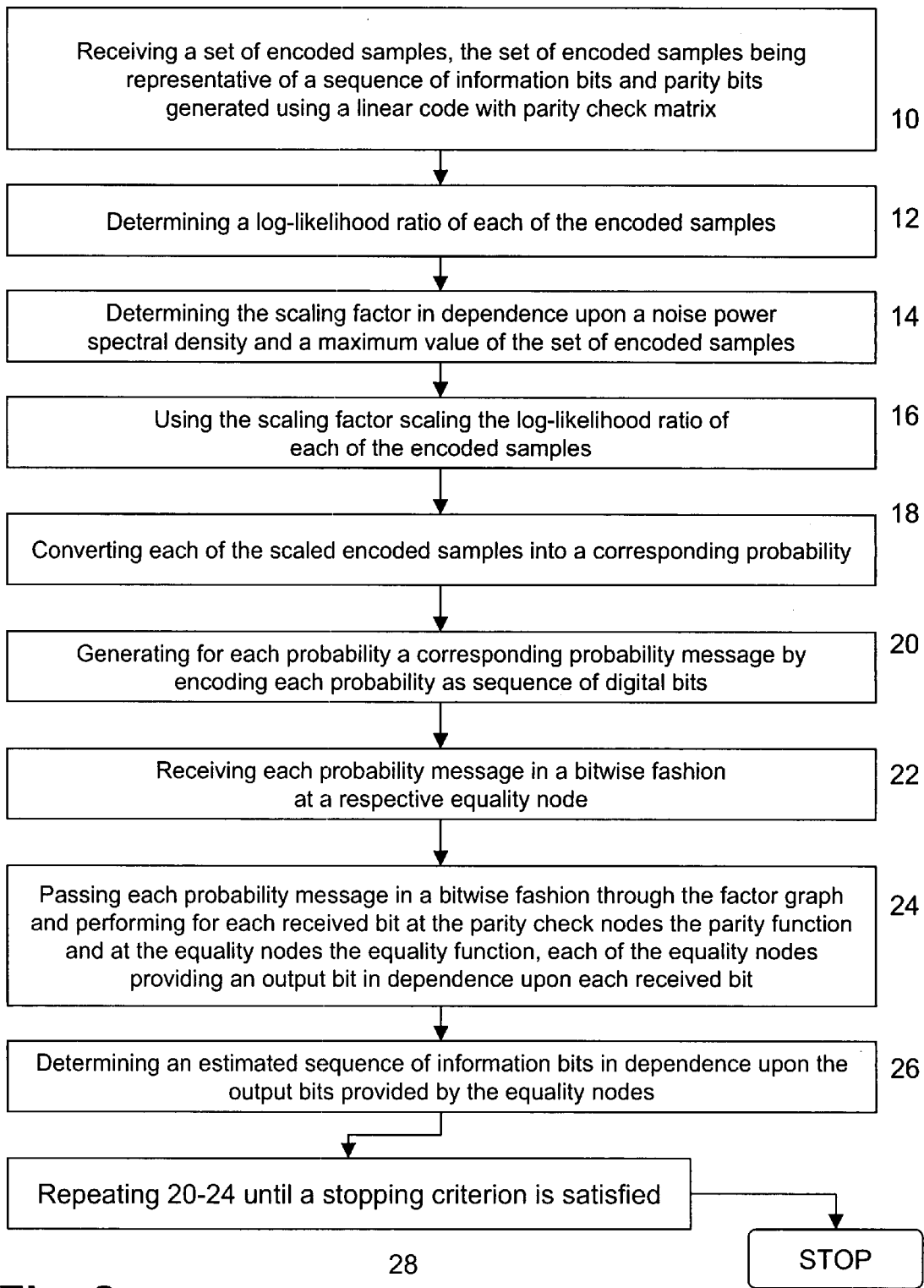

In the following description of the various embodiments same reference numerals will be used for same components. It is noted, that the various embodiments of the stochastic decoder and their modes of operation, as well as combinations thereof, are not limited to decoding of LDPC codes but are advantageous for decoding numerous other classes of linear codes with parity check matrix such as, for example, Repeat-Accumulate codes, Turbo codes and Hamming codes. For simplicity, the various embodiments of the stochastic decoder and their modes of operation are described using a bitwise representation, but it will be apparent to those skilled in the art that they are also implementable using a symbol-wise representation, for example, symbols comprising two bits. Alternatively, symbols comprise a number of outcomes that is other than bit represented—for example decimal numbers. It is further noted, that the various embodiments of the stochastic decoder and their modes of operation, as well as combinations thereof, are not limited to decoding but are also implementable for detection. Referring to FIGS. 7a and 8, a simplified block diagram of a first embodiment of a stochastic decoder 100 according to the invention, and a simplified flow diagram of a first embodiment of a method for stochastic decoding according to the invention for execution on the stochastic decoder 100 are shown, respectively. The stochastic decoder 100 comprises as main components: an input port 102, processing circuitry 104 connected to the input port 102, source circuitry 106 connected to the processing circuitry 104, logic circuitry 108 connected to the processing circuitry, output circuitry 116 connected to the logic circuitry, and output port 120 connected to the output circuitry 116. In operation, a set of encoded samples is received at the input port 102 for decoding—at 10. The set of encoded samples is representative of a sequence of information bits and parity bits generated using a linear code with parity check matrix such as a LDPC code. Upon receipt, the processing circuitry 104 determines a LLR of each of the encoded samples according to equation (2)—at 12. As is evident, determining of the LLR is employed since it is generally used in decoding but the invention is not limited thereto.

According to the invention, a scaling factor in dependence upon a noise power spectral density and a maximum value of the set of encoded samples is then determined—at 14, and using the scaling factor the LLR of each of the encoded samples is scaled—at 16. For example, the scaled LLR, $L'_i$, for the i-th encoded sample, $y_i$, in the received set is calculated as:

$$L'_i = \left(\frac{\alpha N_0}{Y}\right)L_i = \frac{4\alpha y_i}{Y}, \qquad (8)$$

where $N_0 = 2\sigma^2$ is the double-sided noise power spectral density, Y is a fixed maximum value of the received encoded samples and, $\alpha$ is a constant factor with $0<\alpha$. For example, for BPSK transmission of LDPC codes values of Y=6 and $\alpha \cong 3$ provided high performance—Bit Error Rate (BER) performance. As shown above, in Noise-Dependent Scaling (NDS), the received channel LLRs are scaled by a scaling factor proportional to the operating SNR. The scaled LLRs result in probabilities which introduce more switching activity in the stochastic decoder. Because the scaling factor is proportional to the noise level, it ensures a substantially similar level of switching activity over different ranges of SNRs. Of course, one of skill in the art will readily arrive at different methods for implementing the NDS without departing from the scope of the invention as illustrated above. Typically, scaling refers to downscaling though—contrary to common knowledge—it has been recently found that there are situations where upscaling is advantageous.

Using the processing circuitry 104, each of the scaled encoded samples is then—at 18—converted into a corresponding probability, for example according to $P_{init}^i = e^{L_i}/(e^{L_i}+1)$. At 20, for each probability is then a corresponding probability message generated by encoding each probability as a sequence of digital bits. The sequence is a sequence of N '0' bits and M '1' bits with N and M depending on the probability to be encoded, as shown above for the probability of 0.6. For example, the sequence is generated by the processor 104 in communication with the source circuitry 106 with the source circuitry providing bit sets in one of a deterministic, pseudo-random, and random fashion and the processing circuitry using the bit sets for generating the sequence by concatenating the same and ensuring the correct number of '0' bits and '1' bits in dependence upon the probability to be encoded. It has been found that, for the following stochastic decoding process, sequences of digital bits generated using bit sets produced in a deterministic or pseudo-random fashion are sufficient for ensuring proper decoding operation and high performance of the stochastic decoder 100. For example, the source circuitry 106 comprises a Linear Feedback Shift Register (LFSR) for providing bit sets in a pseudo-random fashion.

The logic circuitry 108 comprises logic components forming equality nodes 110 and parity check nodes 112. For example, each equality node 110 comprises two AND gates connected to respective J and K inputs of a JK flip-flop, as shown in FIG. 5b, for performing the equality function—equation (7)—and each parity check node 112 comprises an XOR gate, as shown in FIG. 5a, for performing the parity check function—equation (6). The equality nodes 110 and the parity check nodes 112 are connected such that they represent a factor graph of the parity check matrix, as shown, for example, in FIG. 1. At 22, each probability message is received in a bitwise fashion at a respective equality node 110 and then passed—at 24—in a bitwise fashion through the factor graph while for each received bit the equality function is performed at the equality nodes 110 and the parity check function is performed at the parity check nodes 112. After passage of a bit of each probability message through the factor graph at the end of a DC, each equality node 110 provides an output bit to, for example, a respective up/down counter 114 of the output circuitry 116. The up/down counter 114 is decremented in case of a '0' output bit and increased in case of a '1' output bit. For each DC, the sign bit of each of the up/down counters 114 indicates the "hard" decision, with a '0' sign bit indicating a decoded '+1' and a '1' sign bit indicating a decoded '−1', thus providing—at 26—an estimated sequence of information bits in dependence upon the output bits provided by the equality nodes 110. The above steps 20 to 24 are repeated until a stopping criterion is satisfied—at 28. The stopping criterion is, for example, a predetermined number of DCs unless $H\hat{x}=0$ is satisfied, with H being the parity check matrix and $\hat{x}$ being the estimated sequence of information bits in dependence upon the output bits provided by the equality nodes 110. The steps 26 and 28 are performed using output processing circuitry 118 or, alternatively, processing circuitry 104. The estimated sequence $\hat{x}$ satisfying the criterion $H\hat{x}=0$ or being obtained after the predetermined number of DCs is then provided to the output port 120.

Alternatively, instead of checking the parity check matrix for correctness—$H\hat{x}=0$—the output stream provided by the equality nodes 110 is mapped to bits after each DC using, for example, up/down counters. A decrease in switching activity of the up/down counters is indicative of convergence of the decoding process, i.e. convergence to a binary "1" or a binary "0". This enables substantially simpler and faster detection of convergence of the decoding process. Since the power consumption of the up/down counters is proportional to their switching activity convergence is easily detected by simply measuring the power consumption of the up/down counters.

Figure 7B:
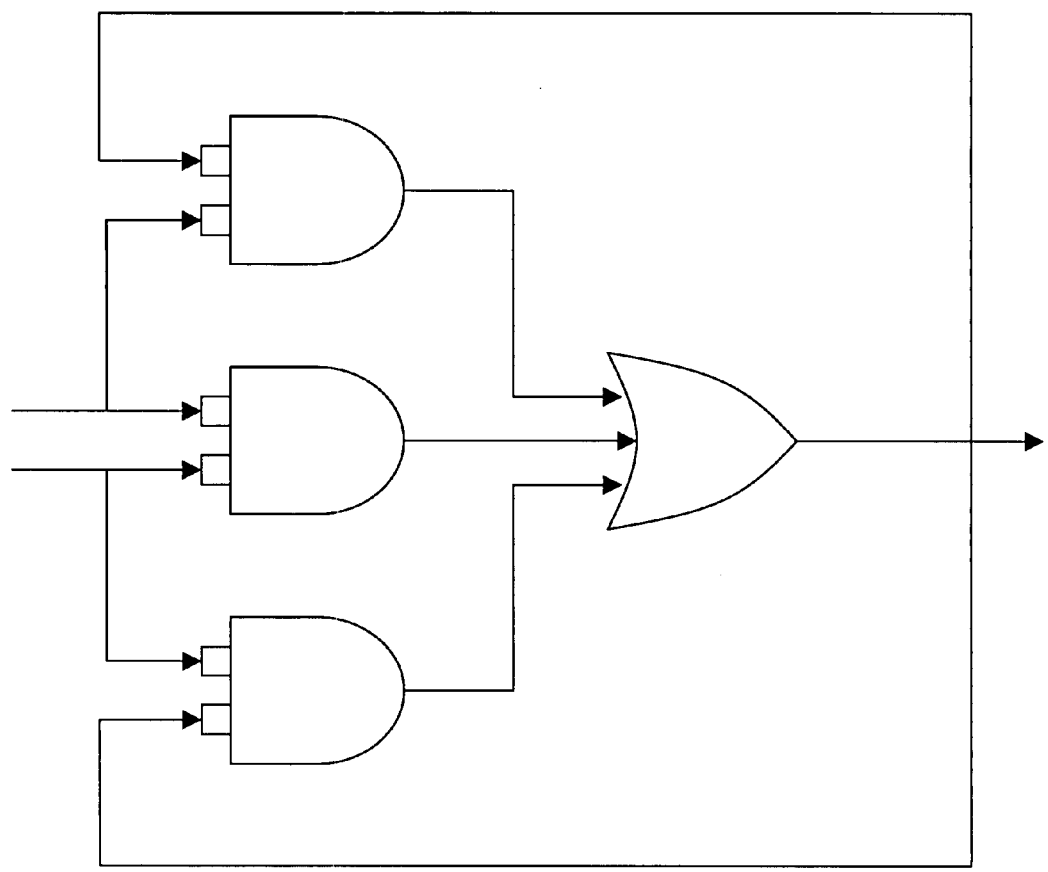
FIG. 7b is a simplified block diagram of a C element.

Optionally, the JK flip-flop is replaced by an asynchronously operated logic component such as, for example, a C element, shown in FIG. 7b. Using an asynchronously operated logic component instead of the JK flip-flop enables operation of the equality nodes 110 and the parity check nodes 112 in an asynchronous fashion, i.e. independent from a clock signal. This provides the potential for substantially increasing the processing speed of the stochastic decoding process.

Further optionally, an upscaling factor is determined other than in dependence upon a noise level. For example, the upscaling factor is determined in an empirical fashion using a test signal.

The stochastic equality node 110 has two states of operation:
 1) regular state—when input bits of the equality node 110 are equal; and,
 2) hold state—when input bits of the equality node 110 are NOT equal.

In the regular state the output bit of the equality node 110 is determined in dependence upon the input bits of the equality node 110. When the equality node 110 is in a hold state, a bit is chosen and provided as output bit of the equality node 110 to de-correlate the stochastic messages, thus reducing the likelihood of the equality nodes 110 getting locked in the hold state. It is possible to assign memory—such as, for example, registers, shift registers, look-up tables, and combinations thereof—to the equality node 110 such that one of its previous output bits are chosen as the output bit when in a hold state. The assigned memory is updated only by bits which are produced in the regular state, referred to as "regenerative bits". Regenerative bits stored in the assigned memory are useful for determining statistics of stochastic streams in the decoder/detector and for producing the output bit in a hold state.

Figure 9A:
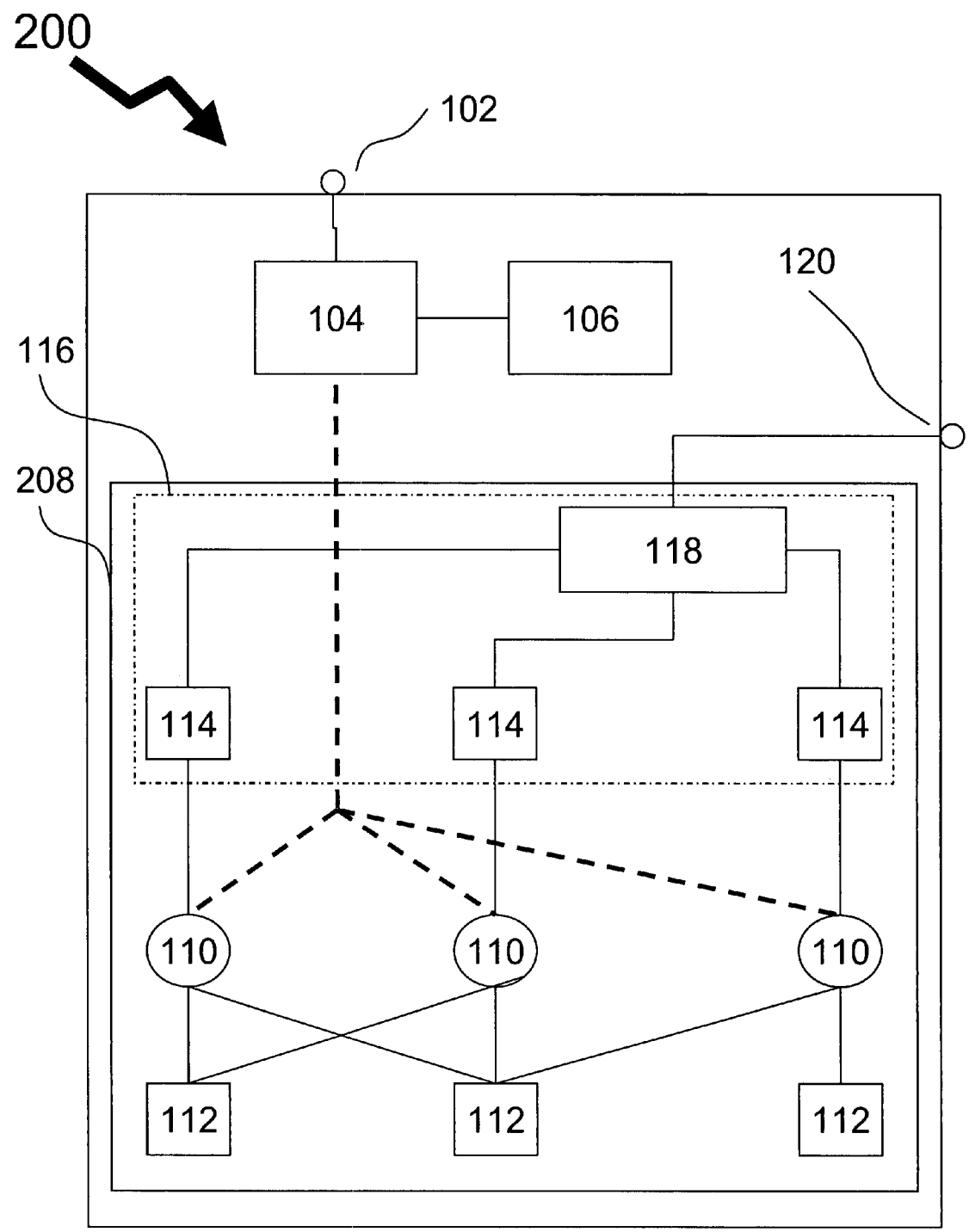
Figure 10:
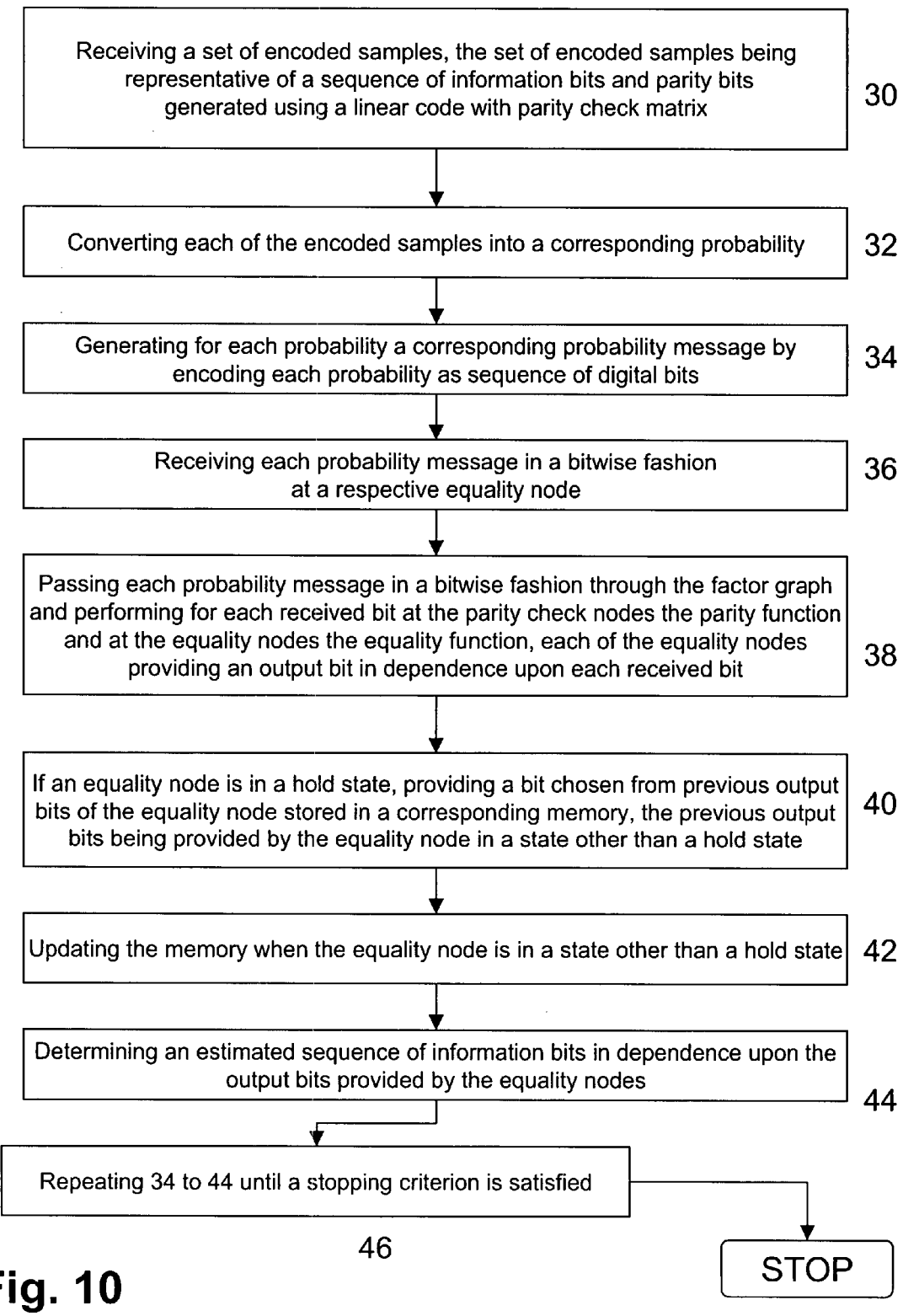
FIG. 10 is a simplified flow diagram of a second embodiment of a method for stochastic decoding according to the invention for execution on the stochastic decoder shown in FIGS. 9a to 9c.

Referring to FIGS. 9a and 10, a simplified block diagram of a second embodiment of a stochastic decoder 200 according to the invention, and a simplified flow diagram of a second embodiment of a method for stochastic decoding according to the invention for execution on the stochastic decoder 200 are shown, respectively. The stochastic decoder 200 comprises same main components as the stochastic decoder 100 illustrated in FIG. 7, except for second source circuitry interposed in the logic circuitry 208 at predetermined locations and in communication with the equality nodes 110. The second source circuitry is interposed for providing a chosen bit if a respective equality node 110—or a group of equality nodes 100—is in a hold state, as explained above with respect to FIG. 6. The second source circuitry comprises a plurality of memories 222 referred to as Edge Memories (EMs) with each EM being connected to a respective equality node 110 at each connection—or edge—of the factor graph. For example, each EM 222 comprises a shift register such as an M-bit shift register with M being an integer number between approximately 8 and 100. Each EM 222 stores output bits of the respective equality node 110 when the respective equality node 110 is in state other than a hold state and provides one of the stored bits when the respective equality node 110 is in a hold state. There are numerous ways for storing and providing the stored output bits such as: storing and providing the stored output bits in a predetermined order; storing the output bits in a predetermined order and providing the stored output bits out of order in a, for example, pseudo-random fashion; and storing and providing the stored output bits out of order in a, for example, pseudo-random fashion. This updating process reduces the chance of locking an equality node 110 into a fixed state because when a hold state occurs, a bit is chosen from the previous output bits which are not produced in a hold state. For example, each EM 222 is placed at a connection connecting the respective equality node 110 with a corresponding parity check node 112 according to the factor graph, as shown in FIG. 9b. Alternatively, each EM 222 is integrated into the respective equality node 110. There various possibilities for choosing the bit from the EM. For example, the bits are chosen in a deterministic fashion such as in a predetermined order: $1^{st}$ bit, $2^{nd}$ bit, . . . ; $1^{st}$ bit, last bit, $2^{nd}$ bit, $2^{nd}$ last bit; etc. Alternatively, the EM 222 is connected to a respective source 224 of one of a pseudo-random and random sequence of digital bits, for example, a LFSR for choosing a stored bit in a pseudo-random fashion. Further alternatively, the EMs are grouped in subsets of EMs with each EM 222 of the subset being connected to a same source 224 of a pseudo-random sequence of digital bits associated therewith, as shown in FIG. 9c. As discussed above, higher degree parity check nodes and equality nodes are easily converted to subgraphs containing only degree three parity check nodes and equality nodes, respectively.

It is noted, that it is also possible to use the EMS—such as, for example, shift-register based EMs—for re-randomizing/de-correlating of the stochastic streams. Here, operation of the EMs is as follows:
 1) in every DC the EMs are updated with any bit received from the edge; and,
 2) In every DC the output bit of an EM is chosen or generated pseudo-randomly or randomly from its content.

Figure 9D:
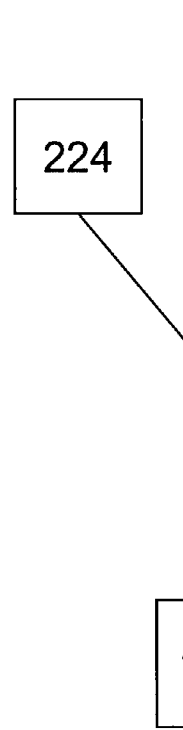
FIG. 9d is a simplified block diagram illustrating an edge memory for re-randomizing the stochastic stream according to the invention.
Figure 9D:
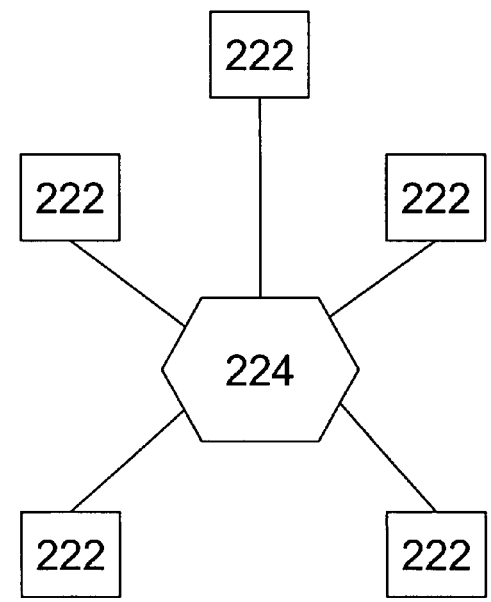
Figure 9D:
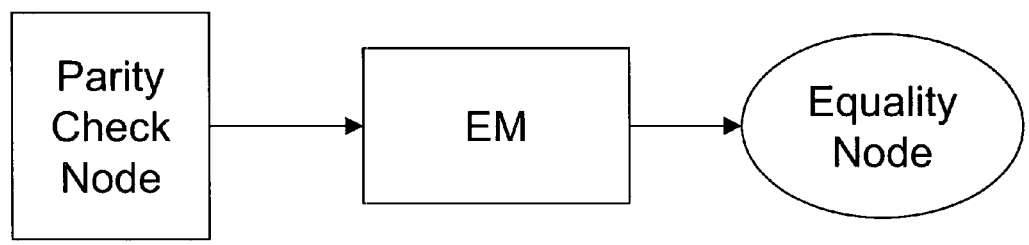

In other words, the EMs gather the incoming bits—any incoming bits or only regenerative bits—from the edge and only re-randomize them. It is possible to place the EMs for re-randomizing the stochastic stream at any location on the edges of the factor graph. For example, it is possible to place the EMs connected to incoming edges of the equality nodes 110 as shown in FIG. 9d.

In operation, a set of encoded samples is received at the input port 102 for decoding—at 30. The set of encoded samples is representative of a sequence of information bits and parity bits generated using a linear code with parity check matrix such as a LDPC code. Using the processing circuitry 104, each of the encoded samples is then—at 32—converted into a corresponding probability. At 34, for each probability is then a corresponding probability message generated by encoding each probability as a sequence of digital bits. At 36, each probability message is received in a bitwise fashion at a respective equality node 110 and then passed—at 38—in a bitwise fashion through the factor graph while for each received bit the equality function is performed at the equality nodes 110 and the parity check function is performed at the parity check nodes 112. If an equality node 110 is in a hold state, a bit chosen—at 40—from previous output bits of the equality node 110 stored in a corresponding memory 222. The previous output bits have been provided by the equality node 110 in a state other than a hold state. At 42, the memory 222 is updated when the equality node 110 in a state other than a hold state. As above, an estimated sequence of information bits in dependence upon the output bits provided by the equality nodes 110 is determined—at 44—and the steps 34 to 44 are repeated until a stopping criterion is satisfied.

It is noted, that the provision of a chosen bit from the EM in case an equality node 110 is in a hold state does not adversely affect the accuracy of the decoded information, since the stochastic decoding process comprises numerous repeated cycles until a stopping criterion is satisfied. However, this method is highly advantageous by substantially preventing an equality node or a group of equality nodes from being locked in a fixed state, thus overcoming to a substantial extent the "latching" problem.

Figure 11:
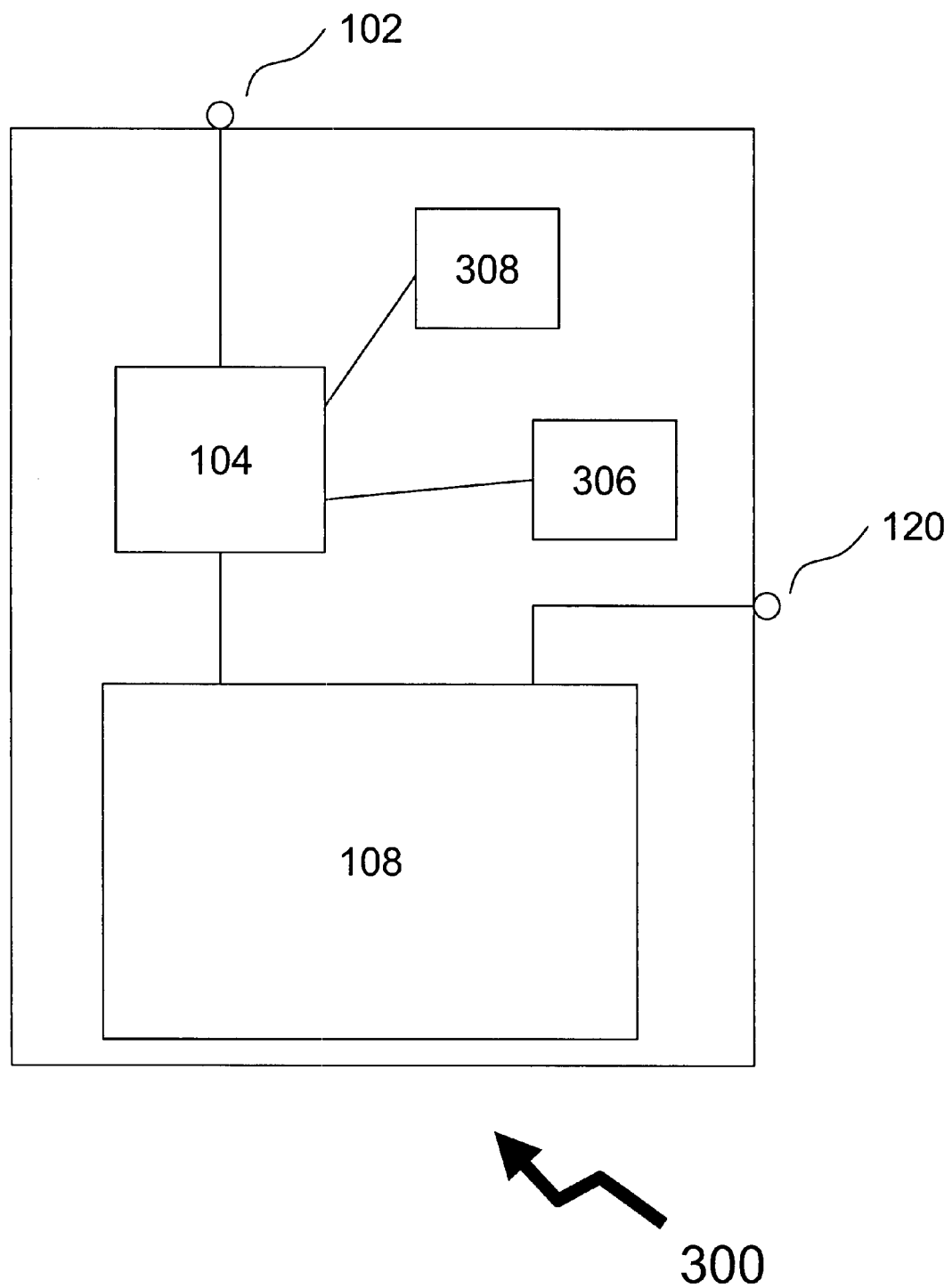
FIG. 11 is a simplified block diagram of a third embodiment of a stochastic decoder according to the invention.
Figure 12:
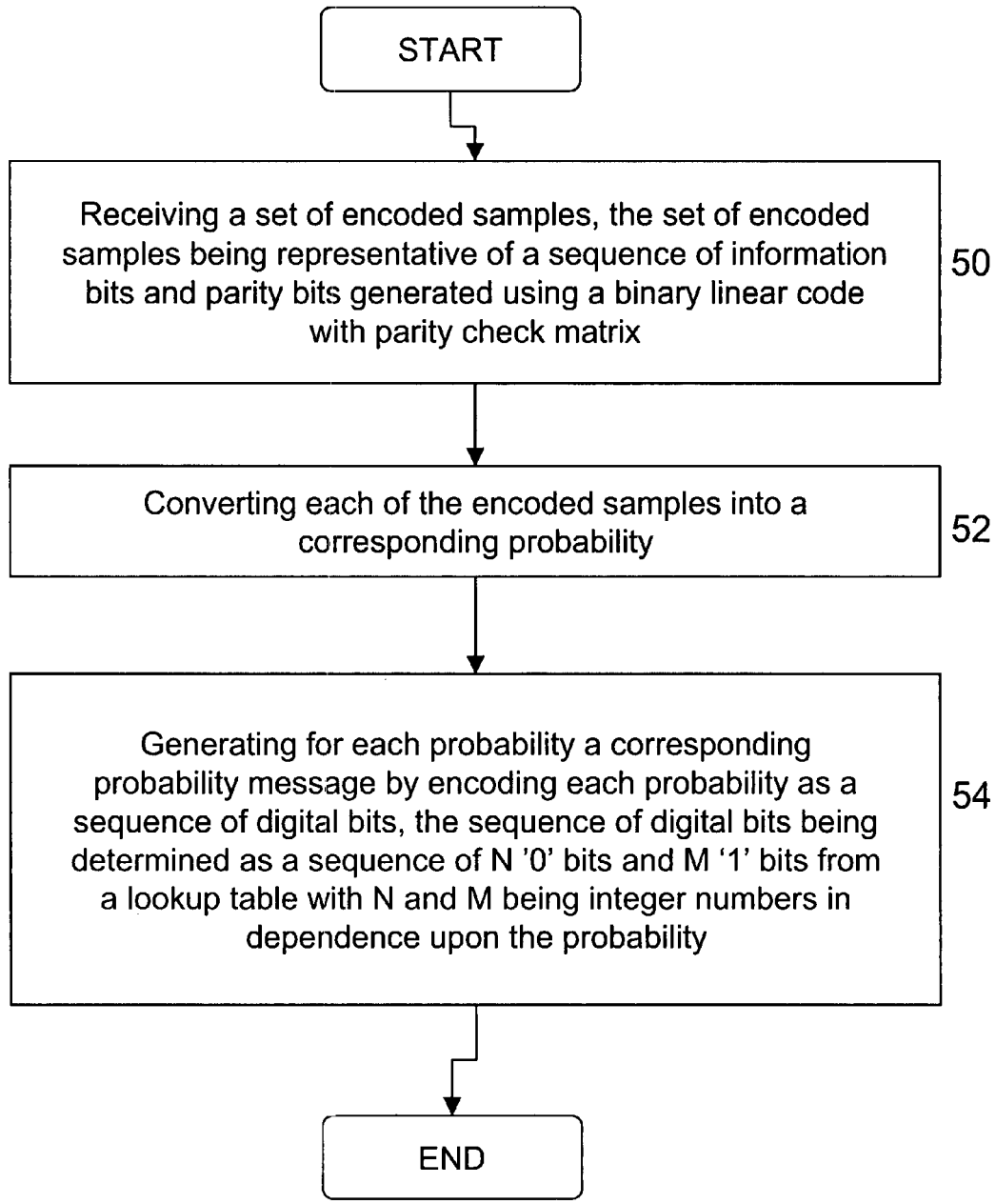
FIG. 12 is a simplified flow diagram of a third embodiment of a method for stochastic decoding according to the invention for execution on the stochastic decoder shown in FIG. 11.

Referring to FIGS. 11 and 12, a simplified block diagram of a third embodiment of a stochastic decoder 300 according to the invention, and a simplified flow diagram of a third embodiment of a method for stochastic decoding according to the invention for execution on the stochastic decoder 300 are shown, respectively. The stochastic decoder 300 comprises same main components as the stochastic decoder 100 illustrated in FIG. 7a, except for memory 306 replacing the source circuitry 106. The memory 306 has stored a plurality of bit sets with each bit set comprising at least a bit. For example, the bit sets are stored in a form of a lookup table. Here, the processing circuitry 104 retrieves selected bit sets from the memory 306 and generates for each probability a corresponding probability message by encoding each probability as a sequence of digital bits with the sequence of digital bits being determined as a sequence of N '0' bits and M '1' bits with N and M being integer numbers in dependence upon the probability. Optionally, source circuitry 308, such as a LFSR, connected to the processing circuitry 104 is provided for enabling the processing circuitry 104 to select at least a portion of the bit sets in a pseudo-random fashion.

In operation, a set of encoded samples is received at the input port 102 for decoding—at 50. The set of encoded samples is representative of a sequence of information bits and parity bits generated using a binary linear code with parity check matrix such as a LDPC code. Using the processing circuitry 104, each of the encoded samples is then—at 52—converted into a corresponding probability. At 54, for each probability is then a corresponding probability message generated by encoding each probability as a sequence of digital bits from the bit sets stored in the memory 306. For example, the sequence of digital bits is generated by expanding a bit set selected from the plurality of bit sets by adding bits to the selected bit set or by concatenating the selected bit set with other bit sets selected from the plurality of bit sets stored in the memory. The following decoding process is the same as shown in FIG. 8—steps 22 to 28.

To ensure the correct number of '0' bits and '1' bits according to the probability to be encoded, the bit sets are selected in a deterministic fashion. Alternatively, a portion of the bit sets is selected in a pseudo-random fashion and the remaining bit sets are selected in a deterministic fashion to ensure the correct number of '0' bits and '1' bits. Further alternatively, a portion of the bit sets is selected in a pseudo-random fashion and the number of '0' bits and '1' bits of the remaining bits is determined and the remaining bits are added accordingly. Yet further alternatively, the bit sets are selected in a pseudo-random fashion, a sequence is generated and then examined if it contains the correct number of '0' bits and '1' bits. This process is repeated until a sequence with the correct number of '0' bits and '1' bits has been generated.

Optionally, the sequence is generated from the bit sets such that it comprises at least a predetermined number of bit transitions, with the number of bit transitions varying in dependence upon the probability.

The generation of the sequence of digital bits using a lookup table is highly advantageous for various reasons. Firstly, it enables substantially faster generation of the sequences than use of a pseudo-random or random source, substantially increasing decoding speed. Secondly, it enables deterministic generation of sequences which is highly advantageous for testing purposes. Thirdly, it enables generation of sequences having at least a predetermined number of bit transitions, thus reducing the likelihood of equality nodes becoming locked in a fixed state.

Alternatively, the probability messages are stored in the memory 306 and are provided in dependence upon a received encoded sample. For example, a plurality of predetermined probability messages is stored in the memory 306 with each probability message having a respective address corresponding to an encoded sample. Upon receipt of an encoded sample the probability message stored at the corresponding address is retrieved from the memory 306. Storing the probability messages in the memory 306 obviates the conversion into probabilities—at 52—and the generation of the probability messages—at 54—is reduced to retrieving of the same from the memory 306, thus processing speed is substantially enhanced. Optionally, the predetermination of the probability messages includes the determination of a scaling factor. Advantageously, such a process is deterministic in nature and is therefore more easily evaluated for quality assurance purposes.

Figure 13:
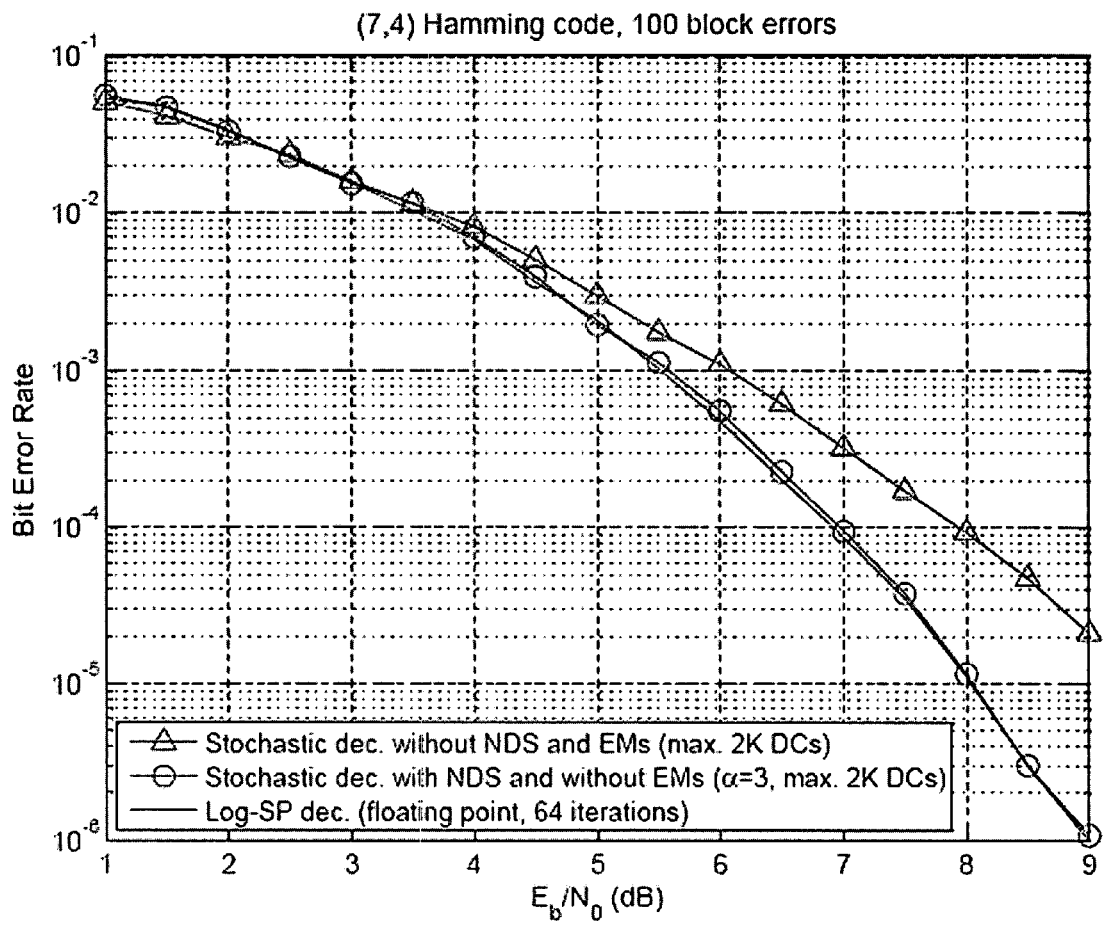
FIG. 13 is a diagram illustrating simulation results of the first embodiment of the stochastic decoder according to the invention for a (7, 4) Hamming code.

FIG. 13 illustrates the BER performance of the first embodiment of the stochastic decoder according to the invention for a (7, 4) Hamming code with $\alpha=3$ and maximum 2K DCs. As shown, the NDS improves the performance of stochastic decoding and provides comparable performance for SNRs compared to SP decoding.

Figure 14:
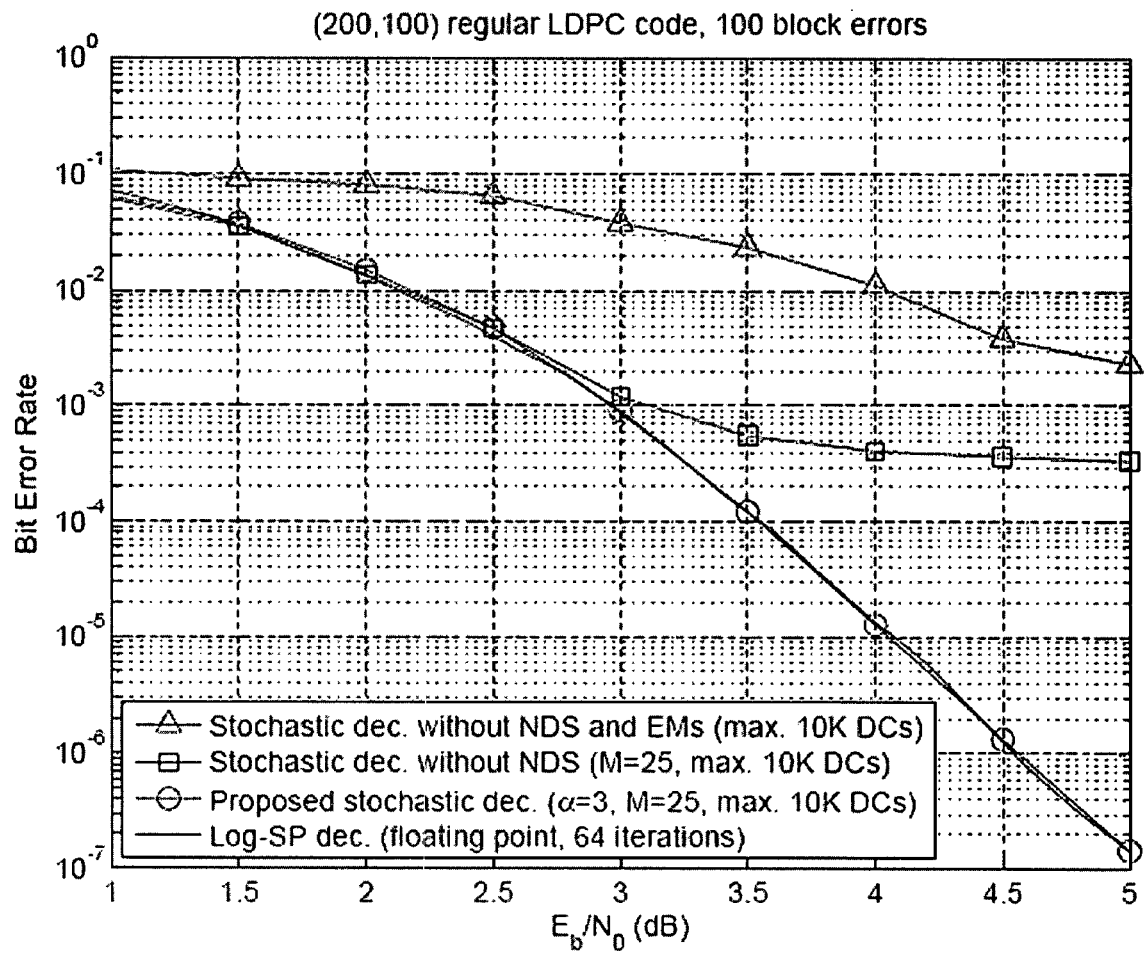
FIGS. 14 and 15 are diagrams illustrating simulation results of the first and second embodiment of the stochastic decoder according to the invention for a (200, 100) LDPC code and for a (1024, 512) LDPC code, respectively; and, FIG. 16 is a simplified block diagram of a fourth embodiment of a stochastic decoder according to the invention.
Figure 15:
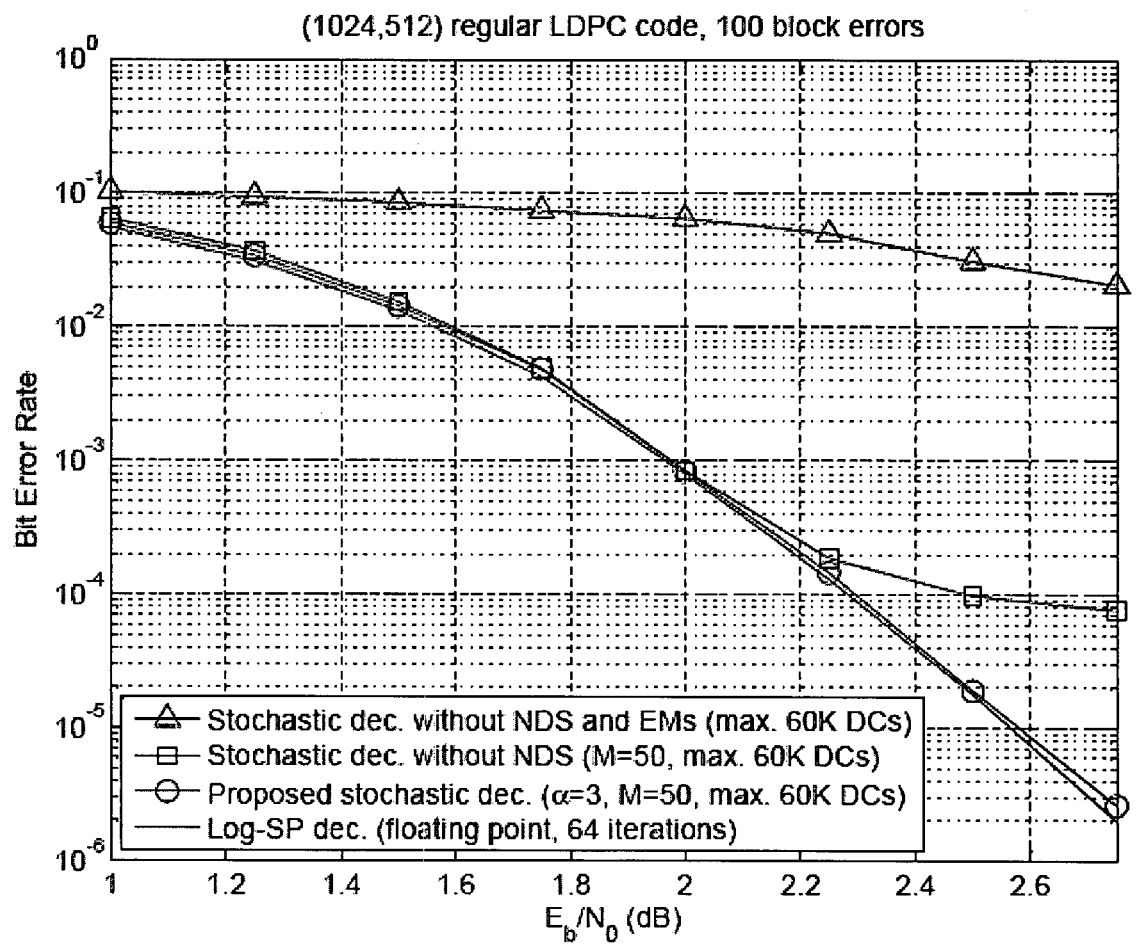

FIGS. 14 and 15 illustrate the BER performance of the first and the second embodiment of the stochastic decoder according to the invention for (200,100) and (1024, 512) LDPC codes, respectively. Both codes are regular and 6-cycle-free with $d_e=3$ equality and $d_c=6$ parity check nodes. The SNR is defined as $E_b/N_0$ in dB, where $E_b$ denotes average energy per bit. M=25 and maximum 10K DCs has been used for decoding the (200,100) LDPC code and, M=50 and maximum 60K DCs for the (1024, 512) LDPC code. $\alpha=3$ has been used for both codes. As shown, with respect to the SP process (SPA) with floating point implementation, a combination of the first and the second embodiment provides comparable BER performance for the (200,100) LDPC code and near-optimal performance for the (1024, 512) LDPC code. The DCs per block are substantially less than the maximum DCs. For example, the average DCs for the (200,100) LDPC code is about 200 at the BER of $10^{-7}$ and for the (1024, 512) LDPC code it is about 6K at the BER of $10^{-5}$. Again, it is noted that the DCs are not equivalent to the iterations in the SP process and due to the low hardware complexity of the stochastic decoder according to the invention, the clock rate is substantially higher than that in a fixed point SP process decoder.

To illustrate the performance contribution of NDS and EMs, results for (i) decoding without NDS and EMs and, (ii) decoding with EMs but without NDS are also depicted in FIGS. 14 and 15. The contribution of EMs is observed by comparing results for case (i) with (ii). Also the contribution of NDS at higher SNRs is easily observed by comparing the results of the combination of the first and second embodiment with case (ii).

The above embodiments of the stochastic decoder according to the invention and combinations thereof are highly advantageous by providing stochastic decoding on factor graph of state-of-the-art LDPC codes by substantially reducing the "latching" problem. The stochastic decoders according to the invention achieve high performance at high-speed while enabling implementation using low-complexity hardware. For example, the stochastic decoder according to the invention is implementable in one of a partially-parallel and a fully-parallel fashion on a single semiconductor chip or on a Field Programmable Gate Array (FPGA).

Figure 16:
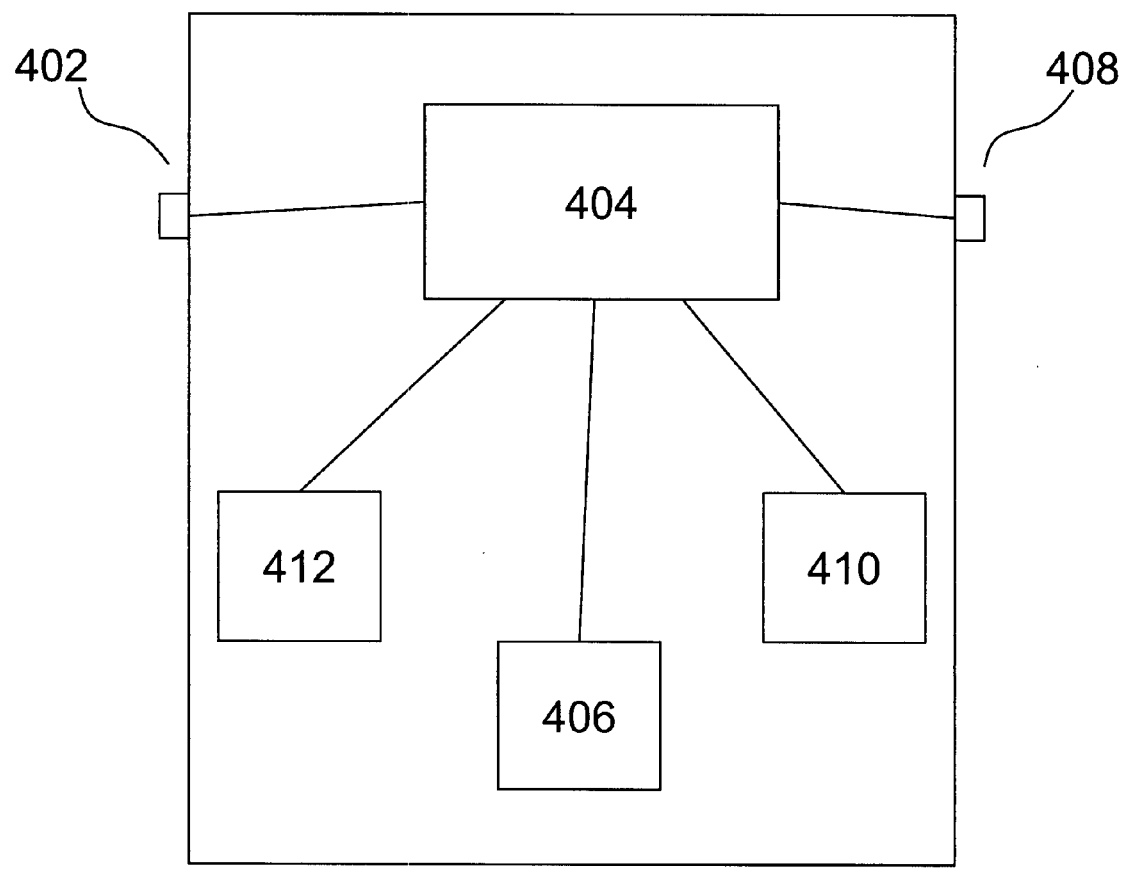

The above embodiments of a method for stochastic decoding are also implementable by executing commands on a processor. Referring to FIG. 16, a simplified block diagram of a fourth embodiment of a stochastic decoder 400 is shown. A set of encoded samples is received at the input port 402. Using electronic circuitry such as a processor 404 the signal data are then digitally processed. The decoder 400 comprises a storage medium 406 having stored therein executable commands for execution on the processor 404 for performing the stochastic decoding corresponding to one of the above processing methods. Alternatively, the processor 404 comprises electronic circuitry designed for performing at least a portion of the signal processing in a hardware implemented fashion. Further alternatively, the decoder 400 comprises a plurality of processors for parallel execution of the stochastic decoding process. The system 400 further comprises an output port 408 for providing the estimated sequence x̂. Optionally, the decoder 400 comprises at least a memory 410 for storing at least one of the output bits, bit sets, and probability messages. Further optionally, the decoder 400 comprises a source circuitry 412 for providing digital bits in one of a pseudo-random and random fashion.

Numerous other embodiments of the invention will be apparent to persons skilled in the art without departing from the spirit and scope of the invention as defined in the appended claims.

What is claimed is:

1. A method for stochastic decoding processing a set of encoded samples comprising:
    a) receiving the set of encoded samples, the set of encoded samples being representative of a sequence of information bits and parity bits generated using a linear code with parity check matrix;
    b) determining for each encoded sample a corresponding probability message;
    c) providing each probability message in a symbol wise fashion to equality nodes of a logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix;
    d) passing each probability message in a symbol wise fashion through the factor graph and performing for each received symbol at the parity check nodes the parity function and at the equality nodes the equality function, each of the equality nodes providing an output symbol in dependence upon each received symbol;
    e) if an equality node is in a hold state, providing a chosen symbol; and,
    f) repeating b) to e) until a stopping criterion is satisfied.

2. A method for stochastic processing a set of encoded samples as defined in claim 1 comprising:
    determining an estimated sequence of information bits in dependence upon the output symbols provided by the equality nodes.

3. A method for stochastic decoding processing a set of encoded samples as defined in claim 1 wherein f) comprises:
    mapping the output symbols to bits after each DC; and,
    determining convergence of the processing in dependence upon switching activity of the mapped output symbols.

4. A method for stochastic processing a set of encoded samples as defined in claim 1 comprising:
    one of downscaling and upscaling each of the encoded samples by a scaling factor, the scaling factor being determined such that switching activity in the stochastic decoder is increased.

5. A method for stochastic processing a set of encoded samples as defined in claim 1 comprising:
    re-randomizing the passing of the probability messages.

6. A method for stochastic decoding processing a set of encoded samples as defined in claim 1 wherein e) comprises choosing a symbol from previous output symbols of the equality node stored in a corresponding memory, the previous output symbols being provided by the equality node in a state other than a hold state.

7. A method for stochastic decoding processing a set of encoded samples as defined in claim 6 wherein the symbol is chosen in one of a pseudo-random and random fashion.

8. A method for stochastic decoding processing a set of encoded samples as defined in claim 6 wherein e) comprises updating the memory when the equality node is in a state other than a hold state.

9. A method for stochastic processing a set of encoded samples comprising:
    receiving the set of encoded samples, the set of encoded samples being representative of a sequence of information bits and parity bits generated using a linear code with parity check matrix;
    scaling each of the encoded samples by a scaling factor proportional to a noise level of the set of encoded samples;
    converting each of the scaled encoded samples into a corresponding probability;
    generating for each probability a corresponding probability message by encoding each probability as a sequence of digital symbols;
    providing each probability message to a respective node of a logic circuitry for stochastic processing, the logic circuitry representing a factor graph of the parity check matrix.

10. A method for stochastic processing a set of encoded samples as defined in claim 9 comprising:
    processing each probability message for determining an estimated sequence of information bits.

11. A method for stochastic processing a set of encoded samples as defined in claim 9 comprising:
    determining a log-likelihood ratio of each of the encoded samples;
    determining the scaling factor in dependence upon a noise power spectral density and a maximum value of the set of encoded samples; and,
    using the scaling factor scaling the log-likelihood ratio of each of the encoded samples.

12. A stochastic decoder for decoding a set of encoded samples comprising:
    an input port for receiving the set of encoded samples, the set of encoded samples being representative of a sequence of information bits and parity bits generated using a linear code with parity check matrix;
    source circuitry for providing a plurality of sequences of digital symbols;

processing circuitry in communication with the input port and the source circuitry, the processing circuitry for determining for each encoded sample a corresponding probability message based on at least a sequence of digital symbols of the plurality of sequences of digital symbols;

logic circuitry in communication with the processing circuitry, the logic circuitry comprising logic components forming equality nodes and parity check nodes, the equality nodes and the parity check nodes for performing an equality function and a parity check function, respectively, the equality nodes and the parity check nodes being connected such that they represent a factor graph of the parity check matrix, the logic circuitry for:

receiving each probability message in a symbol wise fashion at a respective equality node; and, passing each probability message in a symbol wise fashion through the factor graph and performing for each received symbol at the parity check nodes the parity function and at the equality nodes the equality function, each of the equality nodes providing an output symbol in dependence upon each received symbol;

second source circuitry interposed in the logic circuitry at predetermined locations and in communication with the equality nodes for providing a chosen symbol if an equality node is in a hold state; and, output circuitry in communication with the logic circuitry for:

receiving the output symbols from the equality nodes;

determining if a stopping criterion has been satisfied; and, determining an estimated sequence of information bits in dependence upon the output symbols.

13. A stochastic decoder for decoding a set of encoded samples as defined in claim 12 wherein each of the memories comprise a shift register.

14. A stochastic decoder for decoding a set of encoded samples as defined in claim 12 wherein the second source circuitry comprises a plurality of re-randomizing memories, each re-randomizing memory being disposed on an edge of the factor graph for storing symbols received from the corresponding edge and for providing one of the stored symbols in one of a pseudo-random and random fashion.

15. A stochastic decoder for decoding a set of encoded samples as defined in claim 12 wherein the equality nodes and the parity check nodes are connected such that they represent a factor graph of the parity check matrix of a LDPC code.

16. A stochastic decoder for decoding a set of encoded samples as defined in claim 12 wherein the second source circuitry comprises a plurality of memories, each memory being connected to a respective equality node, each memory for storing output symbols of the respective equality node when the respective equality node is in state other than a hold state and for providing one of the stored symbols when the respective equality node is in a hold state.

17. A stochastic decoder for decoding a set of encoded samples as defined in claim 16 wherein each memory is placed within the respective equality node.

18. A stochastic decoder for decoding a set of encoded samples as defined in claim 16 wherein each memory is connected to a respective source of one of a pseudo-random and random sequence of digital bits for choosing a stored symbol.

19. A stochastic decoder for decoding a set of encoded samples as defined in claim 16 wherein each memory is placed at a connection connecting the respective equality node with a corresponding parity check node according to the factor graph.

20. A stochastic decoder for decoding a set of encoded samples as defined in claim 19 wherein the plurality of memories comprises a predetermined number of subsets of memories with each memory of a subset being connected to a same source of one of a pseudo-random and random sequence of digital bits associated therewith.

* * * * *